United States Patent [19]
Itou

[11] Patent Number: 5,875,146
[45] Date of Patent: Feb. 23, 1999

[54] SEMICONDUCTOR INTEGRATED CIRCUIT DEVICE WITH BURST LENGTH INVARIANT INTERNAL CIRCUIT

[75] Inventor: Takashi Itou, Tokyo, Japan

[73] Assignee: Mitsubishi Denki Kabushiki Kaisha, Tokyo, Japan

[21] Appl. No.: 893,718

[22] Filed: Jul. 11, 1997

[30] Foreign Application Priority Data

Feb. 14, 1997 [JP] Japan .................................. 9-030158

[51] Int. Cl.⁶ ...................................................... G11C 7/00
[52] U.S. Cl. ................ 368/226; 365/230.06; 365/189.11
[58] Field of Search .......................... 365/230.06, 189.11, 365/226, 227, 228

[56] References Cited

U.S. PATENT DOCUMENTS 5,283,762  2/1994  Fujishima .......................... 365/189.09
5,715,203  2/1998  Uchida .................................... 365/203
5,777,942  7/1998  Dosaka et al. ...................... 365/230.03

FOREIGN PATENT DOCUMENTS 2-195596  8/1990  Japan .
4-15949   1/1992  Japan .

*Primary Examiner*—Viet Q. Nguyen
*Attorney, Agent, or Firm*—McDermott, Will & Emery

[57] ABSTRACT

A burst mode semiconductor integrated circuit device comprises an internal voltage step-down circuit for stepping down an external power supply voltage to generate an internal power supply voltage based on a particular reference voltage, and a burst length detector for detecting a burst length from address data input from an external system and wherein the internal voltage step-down circuit increases the speed at which the output current rises in response to a drop in the internal power supply voltage as the burst length determined by the burst length detector increases.

11 Claims, 14 Drawing Sheets

5,875,146

SEMICONDUCTOR INTEGRATED CIRCUIT DEVICE WITH BURST LENGTH INVARIANT INTERNAL CIRCUIT

BACKGROUND OF THE INVENTION

1. Field of the Invention

The present invention relates to a semiconductor integrated circuit device, and relates particularly to a semiconductor integrated circuit device operating in a burst mode and comprising an internal power supply circuit for converting a power supply voltage from an external system to a particular voltage and supplying the converted voltage to the internal circuits of the semiconductor integrated circuit device.

2. Description of the Prior Art

FIG. 15 is a block diagram of an 64 Mbit×8 synchronous DRAM device operating in a burst mode according to the prior art.

As shown in FIG. 15, the synchronous DRAM (SDRAM below) 200 device comprises an internal power supply circuit 205, address buffer 206, control signal buffer 207, clock buffer 208, four memory array banks 209, 210, 211, and 212, input/output (I/O) buffer 213 for data input and output, mode register 214, and a control circuit 215 for controlling the memory array banks 209–212 and I/O buffer 213. The internal power supply circuit 205 comprises an internal voltage step-down circuit 201, substrate voltage generator 202, step-up voltage generator 203, and reference voltage generator 204.

The internal voltage step-down circuit 201 drops the power supply voltage supplied from an external system to power supply terminal Vcc to produce an internal power supply voltage int.Vcc to be supplied to the internal circuits of the SDRAM 200. The value of internal power supply voltage int.Vcc is determined according to the reference voltage Vref input from the reference voltage generator 204. More specifically, the internal voltage step-down circuit 201 controls and outputs the internal power supply voltage int.Vcc at the level of the reference voltage Vref supplied from the reference voltage generator 204.

The substrate voltage generator 202 generates and outputs a bias voltage of a semiconductor substrate of the device, and applies a negative substrate voltage Vbb to the semiconductor substrate.

The step-up voltage generator 203 steps up the power supply voltage from the power supply terminal Vcc to generate and supply step-up voltage Vpp to each of the memory array banks 209–212.

The address buffer 206 is connected to the address signal input terminals to which address signals are input from an external system. These input terminals may include, for example, bank address terminals BA0 and BA1 from which the bank address selection signals are input, and the address terminals A0–A11 through which the address signals are input.

The control signal buffer 207 is connected to each of the control signal input terminals through which the control signals are input from the external system. These control signal input terminals include in this example the /CS terminal to which a chip selector signal is input, the /RAS terminal to which a row address strobe signal is input, the /CAS terminal to which a column address strobe signal is input, the /WE terminal to which a write enable signal is input, and the DQM terminal to which an I/O mask signal is input.

The clock buffer 208 generates the internal clock signal from an externally supplied clock signal, and supplies the clock signal to the connected address buffer 206, control signal buffer 207, I/O buffer 213, and control circuit 215. The external clock signal is supplied to the clock buffer 208 through the CLK terminal, and a clock enable signal is supplied to the clock buffer 208 through the CKE terminal.

The control circuit 215 is connected to each of the memory array banks 209–212, the address buffer 206, the control signal buffer 207, and the I/O buffer 213. The mode register 214 is used by the control circuit 215 when determining the burst length from the address signals input from the address signal input terminals.

A typical SDRAM 200 thus comprised can change the burst length to 1, 2, 4, or 8 bits. When, for example, the /CS terminal, /RAS terminal, /CAS terminal, and /WE terminal are all LOW, the control circuit 215 outputs a set signal to the mode register 214, thereby causing the mode register 214 to latch the particular plural address signals input from the address buffer 206 indicating the burst length. The control circuit 215 then references the signal levels latched by the mode register 214 to control the burst length used for burst transfers.

Current consumption is greater when the burst length is long than when the burst length is short, and the drop in the internal power supply voltage int.Vcc and step-up voltage Vpp output from the internal voltage step-down circuit 201 and step-up voltage generator 203 thus increases. In addition, the negative substrate voltage Vbb output from the substrate voltage generator 202 tends to be higher when the burst length is long than when the burst length is short.

SUMMARY OF THE INVENTION

With consideration for the above problems, the object of the present invention is to provide a semiconductor integrated circuit device operating in a burst mode and comprising an internal power supply circuit capable of supplying to the internal circuits of the semiconductor integrated circuit device a stable supply voltage that does not change with the burst length.

To achieve the above object, a burst mode semiconductor integrated circuit device according to the present invention comprises an internal voltage step-down means for stepping down an external power supply voltage to generate and output an internal power supply voltage based on a particular reference voltage, and a burst length evaluation means for determining the burst length from address data input from an external system. In this embodiment the internal voltage step-down means increases the speed at which the output current rises in response to a drop in the internal power supply voltage as the burst length determined by the burst length evaluation means increases.

The internal voltage step-down means in this embodiment preferably comprises a differential amplifier to which the output internal power supply voltage and a particular reference voltage are input, a gain control means for controlling the current flow to the differential amplifier to control the gain of the differential amplifier, and an output circuit for changing the current supply capacity according to the output voltage of the differential amplifier. In this case the gain control means increases the current flow to the differential amplifier and increases the gain of the differential amplifier as the burst length increases.

It is further possible for the gain control means to comprise plural MOS transistors of varying gate sizes for supplying current to the differential amplifier such that a MOS transistor with a larger drain current is operated to increase the current flow to the differential amplifier as the burst length increases.

The gain control means may alternatively comprise plural MOS transistors for supplying current to the differential amplifier such that the number of operating MOS transistors is increased to increase the current flow to the differential amplifier as the burst length increases.

In yet a further alternative embodiment the gain control means comprises a MOS transistor for supplying current to the differential amplifier, and a gate voltage control circuit for controlling the gate voltage of the MOS transistor according to the burst length. In this case the gate voltage control circuit preferably controls the gate voltage of the MOS transistor to increase the current supply to the differential amplifier as the burst length increases.

A burst mode semiconductor integrated circuit device according to a second embodiment of the present invention comprises a reference voltage generating means for generating and outputting plural different reference voltages, an internal voltage step-down means for selecting a reference voltage input from the reference voltage generating means, and stepping down an external power supply voltage to generate an internal power supply voltage based on the selected reference voltage, and a burst length evaluation means for determining the burst length from address data input from an external system. In this embodiment the internal voltage step-down means selects a higher reference voltage as the burst length determined by the burst length evaluation means increases to compensate for a drop in the internal power supply voltage.

The internal voltage step-down means in this embodiment preferably comprises a reference voltage selection means for selecting a reference voltage output from the reference voltage generating means according to the burst length, a differential amplifier to which the output internal power supply voltage and the reference voltage selected by the reference voltage selection means are input, and an output circuit for changing the current supply capacity according to the output voltage of the differential amplifier. In this embodiment the reference voltage selection means selects a higher reference voltage as the burst length increases.

A burst mode semiconductor integrated circuit device according to a third embodiment of the present invention comprises an internal voltage step-down means for stepping down a power supply voltage supplied from an external system to generate and output an internal power supply voltage based on a particular reference voltage, and a burst length evaluation means for determining the burst length from address data input from an external system. In this case the internal voltage step-down means preferably increases the output current supply capacity as the burst length determined by the burst length evaluation means increases.

In this embodiment the internal voltage step-down means preferably comprises a differential amplifier to which the output internal power supply voltage and a particular reference voltage are input, and an output circuit for changing the current supply capacity according to the burst length. In this case the output circuit increases the output current supply capacity as the burst length increases.

The semiconductor integrated circuit device of the invention further preferably comprises a substrate voltage generating means for generating and outputting a semiconductor substrate bias voltage, and applying the substrate voltage to the semiconductor substrate. In this case the substrate voltage generating means improves response to an increase in the substrate voltage, and increases the speed at which a rise in the substrate voltage is detected, as the burst length determined by the burst length evaluation means increases.

The semiconductor integrated circuit device of the invention yet further preferably comprises a step-up voltage generating means for generating and outputting a step-up voltage by boosting the externally supplied power voltage. In this case the step-up voltage generating means improves response to a drop in the step-up voltage, and increases the speed at which a drop in the step-up voltage is detected, as the burst length determined by the burst length evaluation means increases.

A burst mode semiconductor integrated circuit device according to third embodiment of the invention comprises a substrate voltage generating means for generating and outputting a semiconductor substrate bias voltage, and applying the substrate voltage to the semiconductor substrate, and a burst length evaluation means for determining the burst length from address data input from an external system. In this embodiment the substrate voltage generating means improves response to an increase in the substrate voltage, and increases the speed at which a rise in the substrate voltage is detected, as the burst length determined by the burst length evaluation means increases.

In this case the substrate voltage generating means preferably comprises a charge pump circuit for lowering the substrate voltage, and a substrate voltage detecting means for detecting the output substrate voltage, and operating the charge pump circuit when the substrate voltage exceeds a particular value. In this case the substrate voltage detecting means improves response to an increase in the substrate voltage, and increases the speed at which it is detected that the substrate voltage exceeds a particular value, as the burst length increases.

A burst mode semiconductor integrated circuit device according to a fourth embodiment of the invention comprises a step-up voltage generating means for generating and outputting a step-up voltage by boosting the externally supplied power voltage, and a burst length evaluation means for determining the burst length from address data input from an external system. In this case the step-up voltage generating means improves response to a drop in the step-up voltage, and increases the speed at which a drop in the step-up voltage is detected, as the burst length determined by the burst length evaluation means increases.

In this embodiment the step-up voltage generating means preferably comprises a charge pump circuit for boosting the step-up voltage, and a step-up voltage detecting means for detecting the output step-up voltage, and operating the charge pump circuit when the step-up voltage falls below a particular value. In this case the step-up voltage detecting means improves response to a drop in the step-up voltage, and increases the speed at which a drop in the step-up voltage is detected, as the burst length increases.

BRIEF DESCRIPTION OF THE DRAWINGS

The present invention will become more fully understood from the detailed description given below and the accompanying diagrams wherein.

DESCRIPTION OF PREFERRED EMBODIMENTS

The preferred embodiments of the present invention are described below with reference to the accompanying figures.

Embodiment 1

Figure 1:
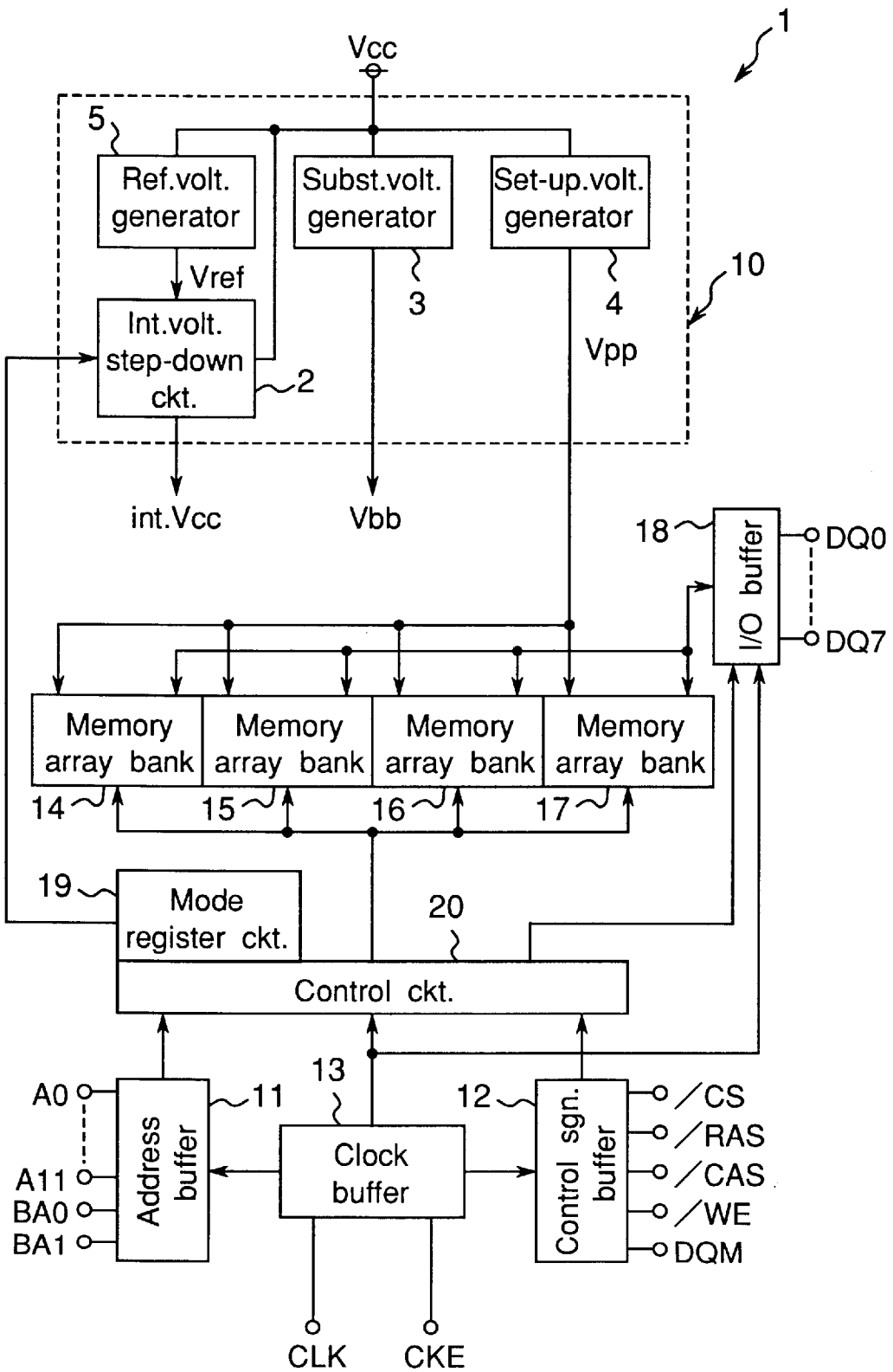
FIG. 1 is a block diagram of a semiconductor integrated circuit device according to a first embodiment of the present invention.

FIG. 1 is a block diagram of a semiconductor integrated circuit device according to a first embodiment of the present invention. Note that a 64 Mbit×8 synchronous DRAM device (SDRAM) operating in a burst mode is shown in FIG. 1 and used by way of example only below. It should be further noted that the SDRAM shown in FIG. 1 can change the burst length to 1, 2, 4, or 8 bits.

As shown in FIG. 1 SDRAM 1 comprises an internal power supply circuit 10, address buffer 11, control signal buffer 12, clock buffer 13, four memory array banks 14, 15, 16, and 17, an input/output (I/O) buffer 18 for data input/output, and a control circuit 20 comprising a mode register 19 and controlling the memory array banks 14–17 and I/O buffer 18. The internal power supply circuit 10 further comprises an internal voltage step-down circuit 2, substrate voltage generator 3, step-up voltage generator 4, and a reference voltage generator 5 for generating and outputting the reference voltage Vref. Note that the internal voltage step-down circuit 2 and reference voltage generator 5 constitute an internal supply voltage step-down circuit, and the mode register 19 is used for burst length evaluation.

The internal power supply circuit 10 is connected to the power supply terminal Vcc from which power is supplied from an external source. The reference voltage generator 5 is connected to the internal voltage step-down circuit 2. The internal voltage step-down circuit 2 is connected to the internal circuits of the SDRAM 1, but these various connections are not shown in the figure. The substrate voltage generator 3 is connected to a semiconductor substrate on which the SDRAM 1 is formed, and these connections are also not shown. The step-up voltage generator 4 is connected to each of the four memory array banks 14–17.

The address buffer 11 is connected to the address signal input terminals to which the address signals are input from an external system. These input terminals may include, for example, bank address terminals BA0 and BA1 from which the bank address selection signals are input, and the address terminals A0–A11 through which the address signals are input. The address buffer 11 is also connected to the control signal buffer 12.

The control signal buffer 12 is connected to each of the control signal input terminals through which the control signals are input from external system. These control signal input terminals include the /CS terminal to which a chip selector signal is input, the /RAS terminal to which a row address strobe signal is input, the /CAS terminal to which a column address strobe signal is input, the /WE terminal to which a write enable signal is input, and the DQM terminal to which an I/O mask signal is input. The control signal buffer 12 is also connected to the control circuit 20.

The clock buffer 13 is connected to the CLK terminal from which an externally supplied clock signal is input, and the CKE terminal from which an externally supplied clock enable signal is input. The clock buffer 13 is also connected to the address buffer 11, control signal buffer 12, I/O buffer 18, and control circuit 20.

The mode register 19 is connected to the internal voltage step-down circuit 2 of the internal power supply circuit 10. The control circuit 20 is connected to each of the memory array banks 14–17 and to the I/O buffer 18. The I/O buffer 18 is connected to the data input/output terminals DQ0–DQ7 used for data input and output.

The internal voltage step-down circuit 2 steps down the power supply voltage input from an external system through the power supply terminal Vcc to generate the internal power supply voltage int.Vcc, and supplies the internal power supply voltage int.Vcc to the internal circuits of the SDRAM 1. Note that the internal power supply voltage int.Vcc is determined based on the reference voltage Vref input from the reference voltage generator 5. More specifically, the internal voltage step-down circuit 2 controls and outputs the internal power supply voltage int.Vcc at the level of the reference voltage Vref supplied from the reference voltage generator 5.

The substrate voltage generator 3 generates and outputs a bias voltage of the semiconductor substrate, and applies a negative substrate voltage Vbb to the semiconductor substrate.

The step-up voltage generator 4 steps up the power supply voltage from the power supply terminal Vcc to generate and supply step-up voltage Vpp to each of the memory array banks 14–17.

The clock buffer 13 generates and outputs the internal clock signal from the externally supplied clock signal. The connected address buffer 11, control signal buffer 12, I/O buffer 18, and control circuit 20 thus operate based on the internal clock signal supplied from the clock buffer 13.

The control circuit 20 uses the mode register 19 when determining the burst length from the address signals input from the address signal input terminals.

When, for example, the /CS terminal, /RAS terminal, /CAS terminal, and /WE terminal are all LOW, the control circuit 20 outputs a set signal to the mode register 19, thereby causing the mode register 19 to latch the particular plural address signals input from the address buffer 11 indicating the burst length. The control circuit 20 then references the signal levels latched by the mode register 19 to control the burst length used for burst transfers. The internal voltage step-down circuit 2 switches the current supply capacity according to the burst length indicated by the signal output from the mode register 19.

Figure 2:
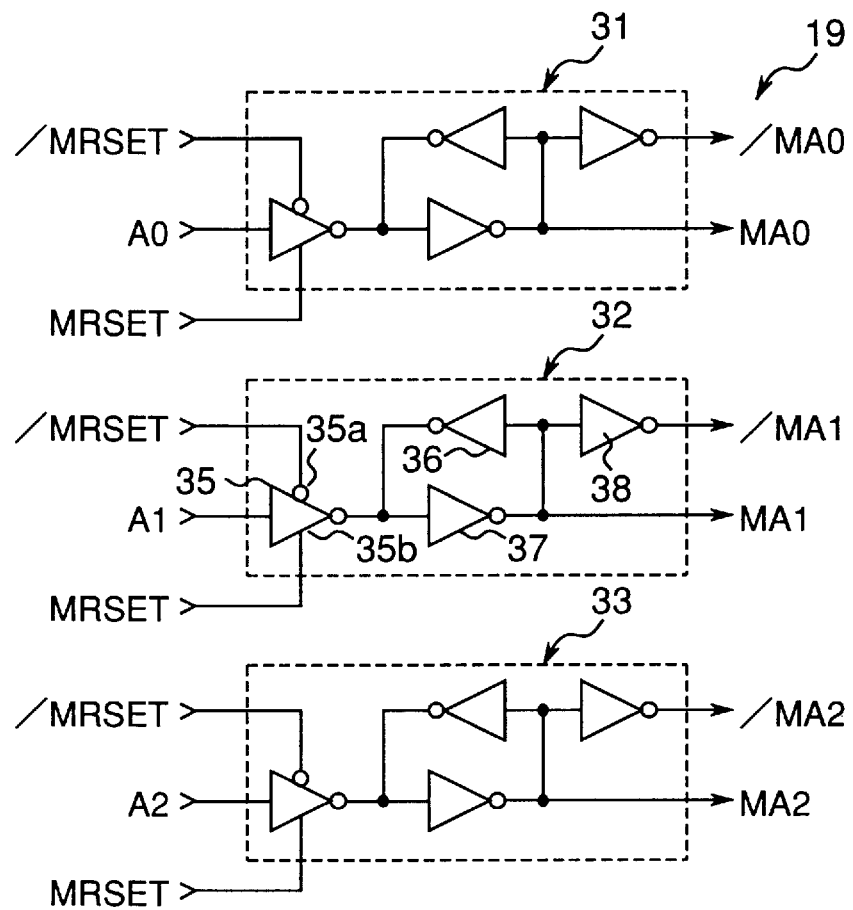
FIG. 2 is a circuit diagram of the mode register 19 shown in FIG. 1.

FIG. 2 is a circuit diagram of the mode register 19 shown in FIG. 1. As shown in FIG. 2 the mode register 19 comprises three register circuits 31, 32, and 33. Because the three register circuits 31, 32, and 33 are identical in construction and operation, only register circuit 32 is described below. As also shown in FIG. 2, register circuit 32 comprises a three state inverter 35 and three inverters 36, 37, and 38.

The three state inverter 35 has two control signal inputs, inverted control input 35a and non-inverted control input 35b. When a LOW level signal is input to inverted control input 35a, and a HIGH is input to non-inverted control input 35b, the three state inverter 35 operates as an inverter. When a HIGH is input to the inverted control input 35a or a LOW is input to the non-inverted control input 35b, a high impedance state is output from the three state inverter 35.

The input to the three state inverter 35 is the input to the register circuit 32, and is the signal input to address signal input terminal A1 of the address buffer 11, and supplied from the address buffer 11 to the control circuit 20. Inverters 36 and 37 are latch circuits. The connection between the output of inverter 36 and the input of inverter 37 is connected to the output of the three state inverter 35. The connection between the input of inverter 36 and the input output of inverter 37 forms non-inverted output MA1 and is connected to the input of inverter 38. The output of inverter 38 is the inverted output /MA1 of the register circuit 32.

When the control circuit 20 sets the register circuit 32, e.g., when the /CS terminal, /RAS terminal, /CAS terminal, and /WE terminal are all LOW, it outputs a HIGH single pulse mode register set signal MRSET to the non-inverted control input 35b of the three state inverter 35, and outputs the inverted mode register set signal /MRSET to the inverted control input 35a. The three state inverter 35 thus operates as an inverter when the mode register set signal MRSET and inverted mode register set signal /MRSET are input.

The address signal input to address signal input terminal A0 of the address buffer 11 is likewise input from the control circuit 20 to the three state inverter functioning as the input to register circuit 31, and the address signal input to address signal input terminal A2 of the address buffer 11 is input from the control circuit 20 to the three state inverter functioning as the input to register circuit 33.

When the control circuit 20 sets the mode register 19, it thus outputs the mode register set signal MRSET to the non-inverted control input of the three state inverter of each register circuit 31–33, and outputs the inverted mode register set signal /MRSET to the inverted control input of each three state inverter. As a result, a 1 data bit input to address signal input terminal A0 is latched by the latch circuit of register circuit 31, a 1 data bit input to address signal input terminal A1 is latched by the latch circuit of register circuit 32, and a 1 data bit input to address signal input terminal A2 is latched by the latch circuit of register circuit 33.

If the non-inverted output of register circuit 31 is further defined as MA0 and the inverted output as /MA0, and the non-inverted output of register circuit 33 is defined as MA2 and the inverted output as /MA2, the control circuit 20 controls the burst length of burst mode operation as shown in the following Table 1 based on the values of MA0, MA1, and MA2.

TABLE 1

| Burst length | MA0 | MA1 | MA2 |
|---|---|---|---|
| 1 | 0 | 0 | 0 |
| 2 | 1 | 0 | 0 |
| 4 | 0 | 1 | 0 |
| 8 | 1 | 1 | 0 |
| reserved | 0 | 0 | 1 |
| reserved | 1 | 0 | 1 |
| reserved | 0 | 1 | 1 |
| reserved | 1 | 1 | 1 |

Note that in Table 1 a LOW signal level is represented as a value of 0, and a HIGH signal level as 1. From Table 1 it is therefore known that the burst length is 1 or 2 when MA1 is LOW (0), and is 4 or 8 when MA1 is HIGH. The values of MA1 and /MA1 can therefore be used to switch the current supply capacity of the internal voltage step-down circuit 2 according to whether the burst length is long or short. More specifically, the current supply capacity of the internal voltage step-down circuit 2 is set to one level when the burst length is 1 or 2, and is set to another level when the burst length is 4 or 8.

Figure 3:
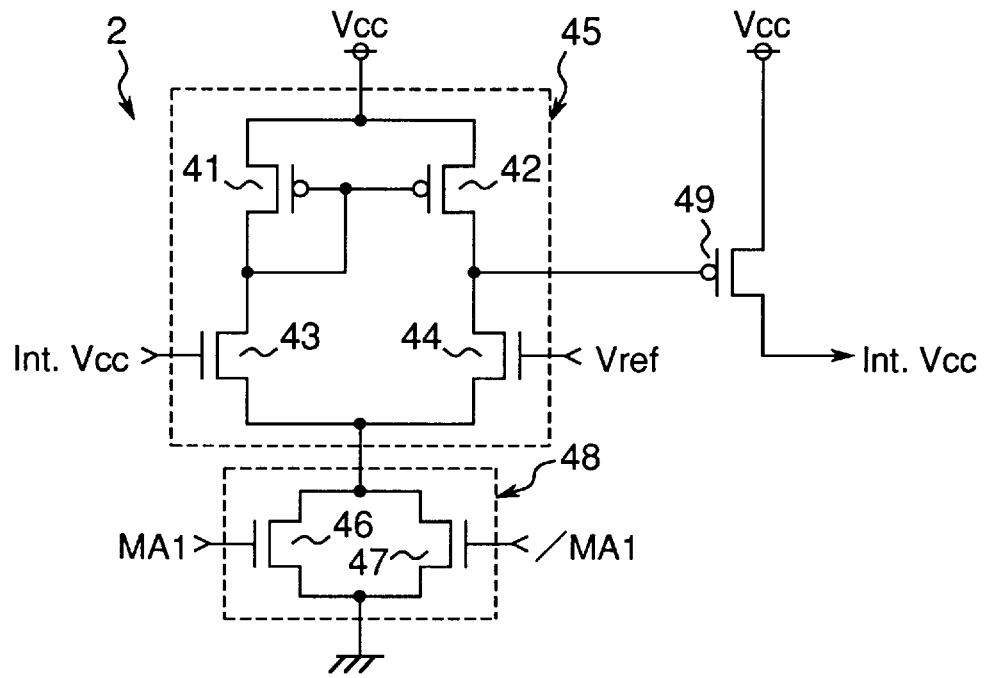
FIG. 3 is a circuit diagram of the internal voltage step-down circuit 2 shown in FIG. 1.

FIG. 3 is a circuit diagram of the internal voltage step-down circuit 2. As shown in FIG. 3, the internal voltage step-down circuit 2 comprises a differential amplifier 45, a gain control circuit 48 for controlling the gain of the differential amplifier 45, and a p-channel MOS transistor 49 constituting the output circuit defined in the appended claims.

The differential amplifier 45 comprises two p-channel MOS transistors 41 and 42 and two n-channel MOS transistors 43 and 44. The gain control circuit 48 comprises two n-channel MOS transistors 46 and 47. Note that the differential amplifier 45 constitutes the differential amplifier defined in the appended claims, the gain control circuit 48 constitutes the gain control means of the claims, and the p-channel MOS transistor 49 constitutes the output circuit defined in the appended claims.

The gates of the p-channel MOS transistors 41 and 42 of the differential amplifier 45 are mutually connected, and this gate connection is connected to the drain of the p-channel MOS transistor 41. The sources of both p-channel MOS transistors 41 and 42 are connected to the power supply terminal Vcc. The drain of p-channel MOS transistor 41 is connected to the drain of n-channel MOS transistor 43. The drain of p-channel MOS transistor 42 is connected to the drain of n-channel MOS transistor 44, and this drain connection is connected to the gate of p-channel MOS transistor 49.

The internal power supply voltage int.Vcc output from the internal voltage step-down circuit 2 is input to the gate of n-channel MOS transistor 43. The gate of n-channel MOS transistor 44 is connected to the reference voltage generator 5, and the reference voltage Vref is thus supplied therefrom to said gate. The sources of n-channel MOS transistors 43 and 44 are mutually connected, and this source connection is connected to the mutual drain connection of n-channel MOS transistors 46 and 47 in the gain control circuit 48.

The sources of the n-channel MOS transistors 46 and 47 are mutually connected to a common ground. The gates of the n-channel MOS transistors 46 and 47 are connected to the mode register 19. The gate of n-channel MOS transistor 46 is connected to the non-inverted output MA1 of register circuit 32, and the gate of n-channel MOS transistor 47 is connected to the inverted output /MA1 of the mode register 19. The source of p-channel MOS transistor 49 is connected to the power supply terminal Vcc, and the drain of p-channel MOS transistor 49 is used as the output terminal of the internal voltage step-down circuit 2. As a result, the internal power supply voltage int.Vcc is output from the drain of p-channel MOS transistor 49.

It should be noted that in this configuration the n-channel MOS transistors 46 and 47 forming the gain control circuit 48 have gates of different capacities such that more current can flow through n-channel MOS transistor 46 than n-channel MOS transistor 47. In other words, the gate of n-channel MOS transistor 47 is either narrower or longer than the gate of n-channel MOS transistor 46.

As a result, when the burst length is 1 or 2, the non-inverted output MA1 of mode register 19 is LOW, the inverted output /MA1 of mode register 19 is HIGH, n-channel MOS transistor 46 is off, n-channel MOS transistor 47 is on, and drain current id12 flows through n-channel MOS transistor 47. When the burst length is 4 or 8, the non-inverted output MA1 of mode register 19 is HIGH, the inverted output /MA1 is LOW, n-channel MOS transistor 46 is on, n-channel MOS transistor 47 is off, and drain current id48 flows through n-channel MOS transistor 46.

Because n-channel MOS transistor 46 is formed to pass more current than n-channel MOS transistor 47, id48>id12. More specifically, the current flowing to the differential amplifier 45 is greater when n-channel MOS transistor 46 is on than when n-channel MOS transistor 47 is on.

The greater the current flowing to differential amplifier 45, the greater the gain of differential amplifier 45 and the better the response. As a result, the gate voltage of p-channel MOS transistor 49 can be dropped quickly when there is a drop in the internal power supply voltage int.Vcc. Current flow also increases when the gate voltage of p-channel MOS transistor 49 drops.

It is therefore possible to rapidly increase the current flow in a short time in response to a drop in the internal power supply voltage int.Vcc when the burst length changes to 4 or 8 from 1 or 2, and it is thus possible to prevent a drop in the internal power supply voltage int.Vcc resulting from a long burst length.

Figure 4:
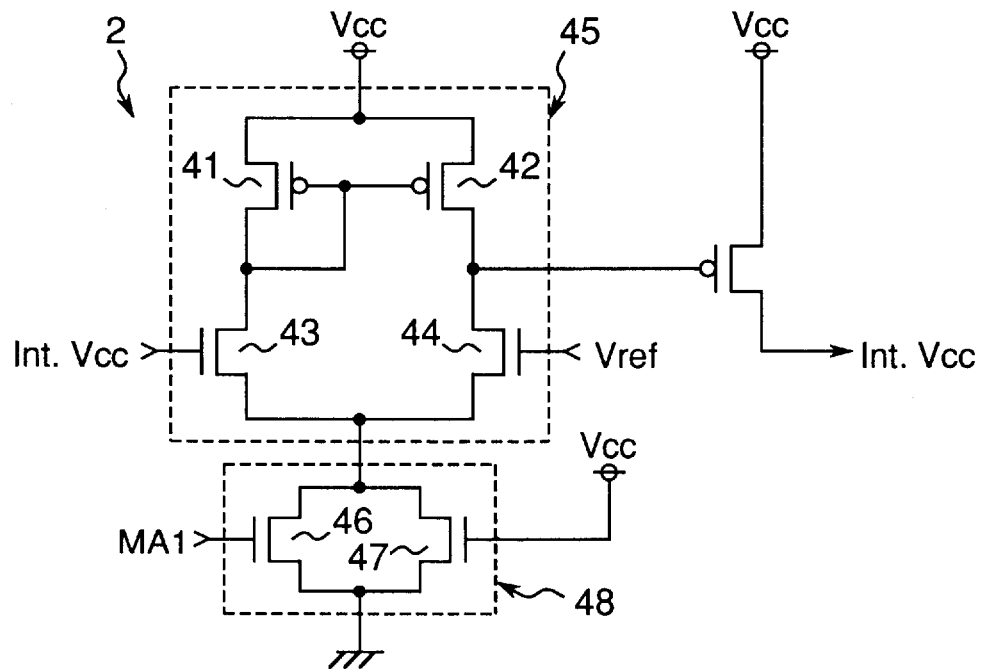
FIG. 4 is a circuit diagram of an alternative embodiment of the internal voltage step-down circuit 2 shown in FIG. 1.

It should be noted that while the gate of n-channel MOS transistor 47 is connected to the inverted output /MA1 of mode register 19 in the embodiment shown in FIG. 3, it is also possible to connect the gate of n-channel MOS transistor 47 to the power supply terminal Vcc rather than to the inverted output /MA1 as shown in FIG. 4 so that the gate is always HIGH and the n-channel MOS transistor 47 is always on. If thus comprised only n-channel MOS transistor 47 will be on when the burst length is 1 or 2, and when the burst length is 4 or 8 both n-channel MOS transistors 46 and 47 will be on. As a result the current flowing to the differential amplifier 45 will be greater when the burst length is 4 or 8 than when the burst length is 1 or 2, and the same effects as achieved with the configuration shown in FIG. 3 can be achieved.

The semiconductor integrated circuit device according to the first embodiment of the invention thus adjusts the response by changing the gain of the differential amplifier 45 of the internal voltage step-down circuit 2 according to the burst length. More specifically, the gain of the differential amplifier 45 is greater when the burst length is 4 or 8 than when the burst length is 1 or 2, and the response of the internal voltage step-down circuit 2 is thus improved. When the burst length is 4 or 8 the internal voltage step-down circuit 2 can thus supply more current in a short time in response to a potential drop in the internal power supply voltage int.Vcc, and the drop in the internal power supply voltage int.Vcc that occurs in conventional devices when the burst length is long can be prevented. It is also possible to reduce current consumption by the differential amplifier 45 when the burst length is short, and the current consumption of a SDRAM device can be reduced.

Embodiment 2

The first embodiment as described above comprises a gain control circuit 48 consisting of n-channel MOS transistors 46 and 47, and operates these two n-channel MOS transistors 46 and 47 so that the current flowing to the differential amplifier 45 is different when the burst length is 1 or 2 and when the burst length is 4 or 8. By thus changing the current flow to the differential amplifier 45, the gain control circuit 48 changes the gain of differential amplifier 45 and thereby changes the response of the internal voltage step-down circuit 2.

It is also possible, however, to control the current flowing to the differential amplifier 45 using a single n-channel MOS transistor as described below according to the second embodiment of the invention.

Figure 5:
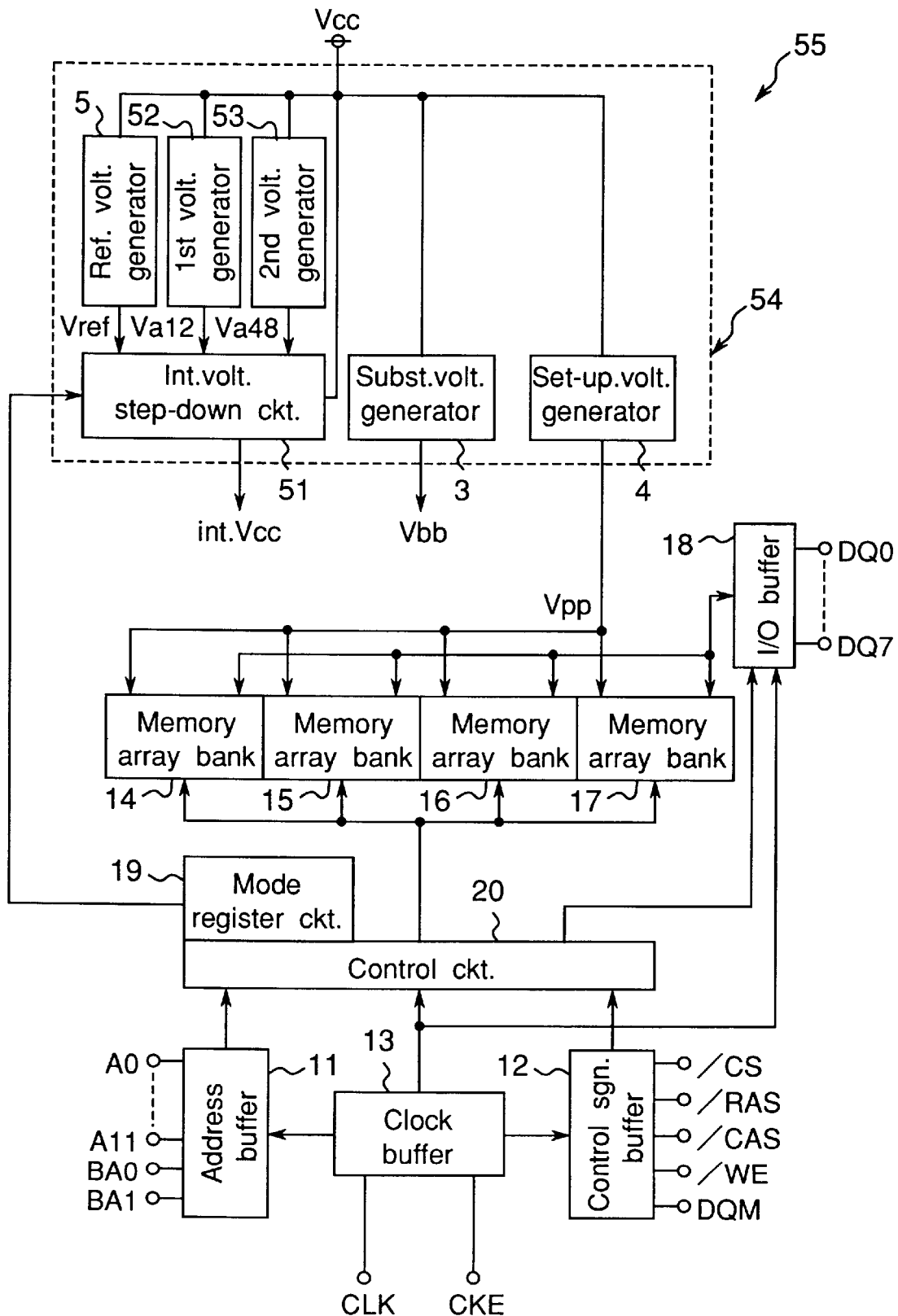
FIG. 5 is a block diagram of a semiconductor integrated circuit device according to the second embodiment of the invention.

FIG. 5 is a block diagram of a semiconductor integrated circuit device according to the second embodiment of the invention, which is described below using by way of example only a 64 Mbit×8 synchronous DRAM (SDRAM) device that operates in a burst mode. Note that like parts in FIG. 5 and FIG. 1 are identified by the same reference numerals, and further description thereof is omitted below. Only the differences between the first embodiment above and the second embodiment are described below. Note, further, that the SDRAM shown in FIG. 5 is again assumed to be capable of setting the burst length to 1, 2, 4, or 8 bits.

The semiconductor integrated circuit device shown in FIG. 5 differs from that in FIG. 1 in the construction of the internal power supply circuit. More specifically, the circuit design of the internal voltage step-down circuit 51 of the internal power supply circuit 54 of the second embodiment has been changed from that of the internal voltage step-down circuit 2 in FIG. 1. The internal power supply circuit 54 further comprises a first voltage generator 52 for generating and outputting a particular voltage Va12, and a second voltage generator 53 for generating and outputting a particular voltage Va48, in addition to the internal voltage step-down circuit 51, reference voltage generator 5, substrate voltage generator 3, and step-up voltage generator 4

The SDRAM 55 of this second embodiment thus comprises as shown in FIG. 5 an internal power supply circuit 54 as described above, an address buffer 11, control signal buffer 12, clock buffer 13, four memory array banks 14–17, an input/output (I/O) buffer 18 for data input/output, and a control circuit 20 comprising a mode register 19 and controlling the memory array banks 14–17 and I/O buffer 18.

The internal power supply circuit 54 is connected to the power supply terminal Vcc from which power is supplied from an external system. The reference voltage generator 5, first voltage generator 52, and second voltage generator 53 are connected to the internal voltage step-down circuit 51. The internal voltage step-down circuit 51 is connected to the internal circuits of the SDRAM 1, but these various connections are not shown in the figure. The mode register 19 is also connected to the internal voltage step-down circuit 51.

The internal voltage step-down circuit 51 steps down the power supply voltage input from an external system through the power supply terminal Vcc to generate the internal power supply voltage int.Vcc, and supplies the internal power supply voltage int.Vcc to the internal circuits of the SDRAM 55. Note that the internal power supply voltage int.Vcc is determined based on the reference voltage Vref input from the reference voltage generator 5. More specifically, the internal voltage step-down circuit 51 controls and outputs the internal power supply voltage int.Vcc at the level of the reference voltage Vref supplied from the reference voltage generator 5. The current supply capacity of the internal voltage step-down circuit 51 is switched according to the burst length signal output from the mode register 19.

Figure 6:
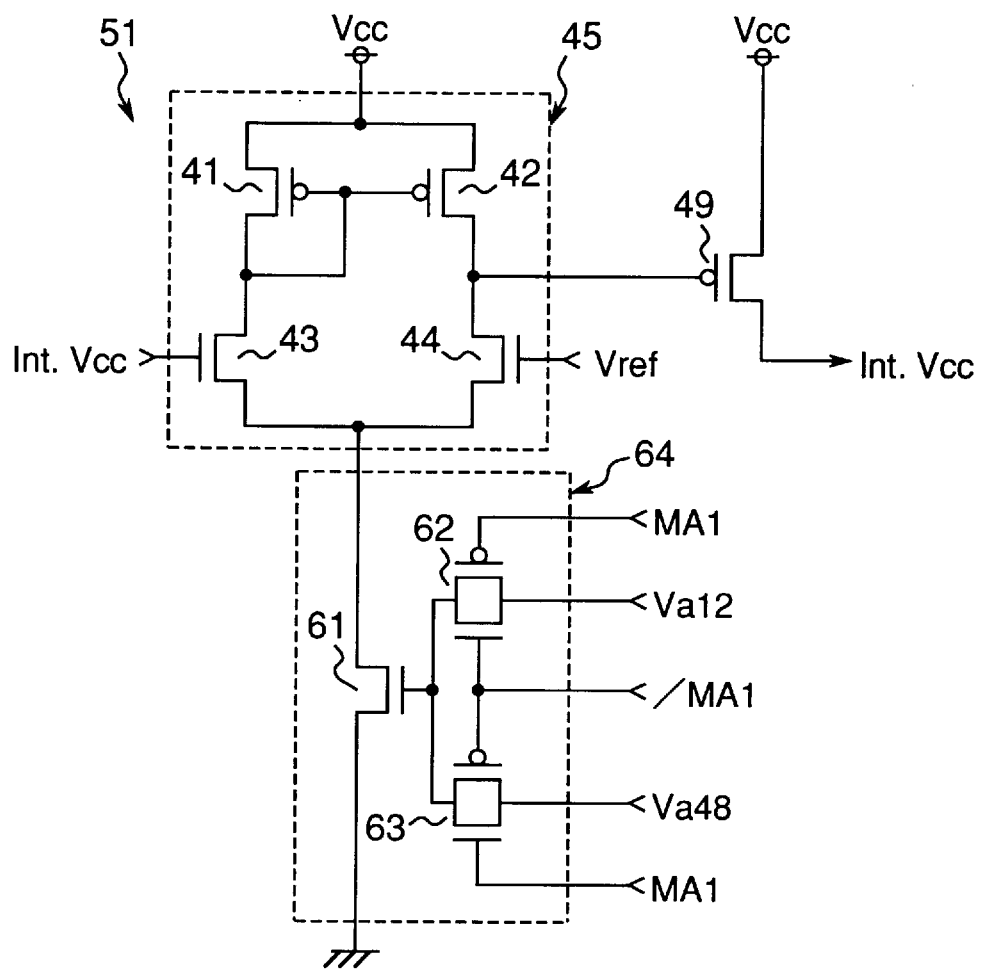
FIG. 6 is a circuit diagram of the internal voltage step-down circuit 51 shown in FIG. 5.

FIG. 6 is a circuit diagram of the internal voltage step-down circuit 51. Note that like parts in FIG. 6 and FIG. 3 are identified by the same reference numerals, and further description thereof is omitted below where only the differences are explained.

The internal voltage step-down circuit 51 shown in FIG. 6 differs from that in FIG. 3 in the construction of the gain control circuit 64, which comprises in this embodiment an n-channel MOS transistor 61 and two transmission gates 62 and 63.

It should be noted that the gain control circuit 64, first voltage generator 52, and second voltage generator 53 constitute the gain control means defined in the appended claims, and the transmission gates 62 and 63 constitute the gate voltage control circuit of the claims.

As shown in FIG. 6, the internal voltage step-down circuit 51 comprises a differential amplifier 45, a gain control circuit 64, and a p-channel MOS transistor 49 functioning as the output circuit of the internal voltage step-down circuit 51. The gain control circuit 64 comprises n-channel MOS transistor 61, transmission gates 62 and 63, and controls the gain of the differential amplifier 45.

The sources of the n-channel MOS transistors 43 and 44 are connected together, and this source connection is connected to the drain of the n-channel MOS transistor 61. The source of the n-channel MOS transistor 61 is grounded. The gate of the n-channel MOS transistor 61 is connected to the outputs of the transmission gates 62 and 63. The input of transmission gate 62 is connected to the first voltage generator 52, and the input of the other transmission gate 63 is connected to the second voltage generator 53.

The non-inverted output MA1 of the mode register 19 is connected to the gate of the p-channel MOS transistor that is a part of transmission gate 62, and the gate of the n-channel MOS transistor that is a part of the other transmission gate 63. The inverted output /MA1 of the mode register 19 is connected to the gate of the n-channel MOS transistor of transmission gate 62, and to the gate of the p-channel MOS transistor of transmission gate 63.

Thus comprised, the particular voltage Va12 output from the first voltage generator 52 is input to the input of the transmission gate 62, and the particular voltage Va48 from the second voltage generator 53 is input to the input of transmission gate 63. Note that Va48>Va12.

When the burst length is 1 or 2, the non-inverted output MA1 of mode register 19 is LOW, and the inverted output /MA1 is HIGH. As a result, transmission gate 63 is off so that current flow is blocked, and transmission gate 62 is on so that current passes and the particular voltage Va12 is input to the gate of n-channel MOS transistor 61.

When the burst length is 4 or 8, the non-inverted output MA1 of mode register 19 is HIGH, and the inverted output /MA1 is LOW. In this case transmission gate 62 is off so that current flow is blocked, and transmission gate 63 is on so that current passes and the particular voltage Va48 is input to the gate of n-channel MOS transistor 61.

Because Va48>Va12, the voltage input to the gate of n-channel MOS transistor 61 is higher when the burst length is 4 or 8 than when the burst length is 1 or 2. In other words, the drain current of the n-channel MOS transistor 61 increases and the current flowing to the differential amplifier 45 increases.

The greater the current flowing to differential amplifier 45, the greater the gain of differential amplifier 45 and the better the response. As a result, the gate voltage of p-channel MOS transistor 49 can be dropped quickly when there is a drop in the internal power supply voltage int.Vcc. Current flow also increases when the gate voltage of p-channel MOS transistor 49 drops.

It is therefore possible to rapidly increase the current flow in a short time in response to a drop in the internal power supply voltage int.Vcc when the burst length changes to 4 or 8 from 1 or 2, and it is thus possible to prevent a drop in the internal power supply voltage int.Vcc resulting from a long burst length.

The semiconductor integrated circuit device according to the second embodiment of the invention thus adjusts the response by changing the gain of the differential amplifier 45 of the internal voltage step-down circuit 51 according to the burst length. More specifically, the gain of the differential amplifier 45 is greater when the burst length is 4 or 8 than when the burst length is 1 or 2, and the response of the internal voltage step-down circuit 51 is thus improved. When the burst length is 4 or 8 the internal voltage step-down circuit 51 can thus supply more current in a short time in response to a potential drop in the internal power supply voltage int.Vcc, and the drop in the internal power supply voltage int.Vcc that occurs in conventional devices when the burst length is long can be prevented. It is also possible to reduce current consumption by the differential amplifier 45 when the burst length is short, and the current consumption of a SDRAM device can be reduced.

Embodiment 3

The first and second embodiments as described above change the current flow to the differential amplifier 45 to change the gain of the differential amplifier 45 and thereby change the response of the internal voltage step-down circuit. It is also possible, however, to change the gate voltage input to the gate of the n-channel MOS transistor 44 of the differential amplifier 45, i.e., the reference voltage, when the burst length is 1 or 2 and when the burst length is 4 or 8 to compensate for the drop in the internal power supply voltage int.Vcc that occurs when the burst length is long. A semiconductor integrated circuit device that operates in this manner is described below as the third embodiment of the invention.

Figure 7:
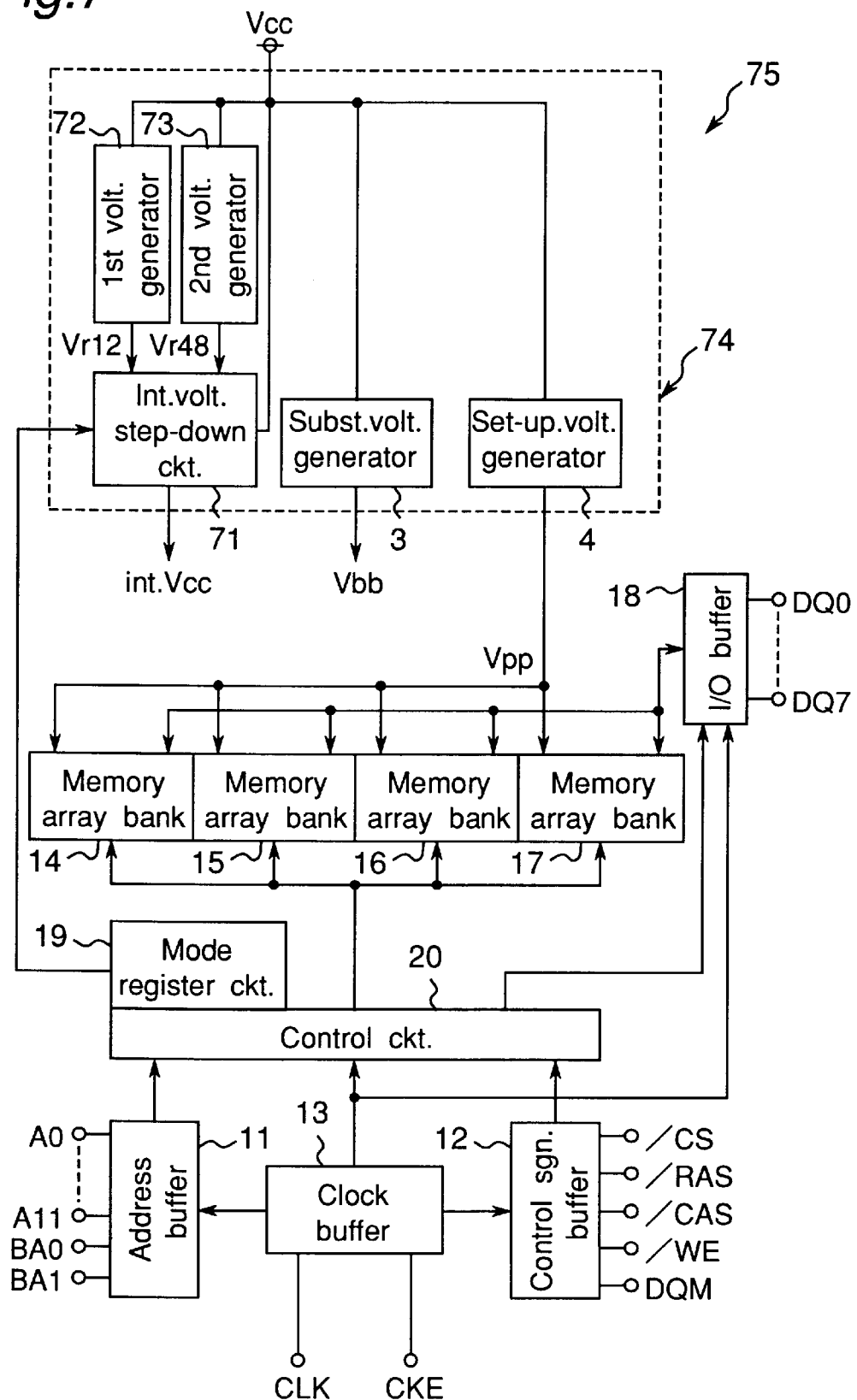
FIG. 7 is a block diagram of a semiconductor integrated circuit device according to the third embodiment of the invention.

FIG. 7 is a block diagram of a semiconductor integrated circuit device according to the third embodiment of the invention, which is described below using by way of example only a 64 Mbit×8 synchronous DRAM (SDRAM) device that operates in a burst mode. Note that like parts in FIG. 7 and FIG. 1 are identified by the same reference numerals, and further description thereof is omitted below. Only the differences between the first embodiment above and the third embodiment are described below. Note, further, that the SDRAM shown in FIG. 7 is again assumed to be capable of setting the burst length to 1, 2, 4, or 8 bits.

The semiconductor integrated circuit device shown in FIG. 7 differs from that in FIG. 1 in the construction of the internal power supply circuit 74. More specifically, the circuit design of the internal voltage step-down circuit 71 of the internal power supply circuit 74 of the third embodiment has been changed from that of the internal voltage step-down circuit 2 in FIG. 1; the reference voltage generator 5 has been eliminated; and a first reference voltage generator 72 for generating and outputting reference voltage Vr12, and second reference voltage generator 73 for generating and outputting reference voltage Vr48 have been added.

The internal power supply circuit 74 of the SDRAM 75 of this third embodiment thus comprises an internal voltage step-down circuit 71, first reference voltage generator 72, second reference voltage generator 73, substrate voltage generator 3, and step-up voltage generator 4.

As shown in FIG. 7, the SDRAM 75 of this third embodiment thus comprises the above internal power supply circuit 74, an address buffer 11, control signal buffer 12, clock buffer 13, four memory array banks 14–17, an input/output (I/O) buffer 18 for data input/output, and a control circuit 20 comprising a mode register 19 and controlling the memory array banks 14–17 and I/O buffer 18.

The internal power supply circuit 74 is connected to the power supply terminal Vcc from which power is supplied from an external system. The first reference voltage generator 72 and second reference voltage generator 73 are connected to the internal voltage step-down circuit 71, and the internal voltage step-down circuit 71 is connected to the internal circuits of the SDRAM 1, but these various connections are not shown in the figure. The mode register 19 is also connected to the internal voltage step-down circuit 71.

The internal voltage step-down circuit 71 steps down the power supply voltage input from an external system through the power supply terminal Vcc to generate the internal power supply voltage int.Vcc, and supplies the internal power supply voltage int.Vcc to the internal circuits of the SDRAM 75. Note that the internal power supply voltage int.Vcc is determined based on the reference voltage Vr12 input from the first reference voltage generator 72 or the reference voltage Vr48 input from the second reference voltage generator 73. More specifically, the internal voltage step-down circuit 71 controls and outputs the internal power supply voltage int.Vcc at the level of the reference voltage Vr12 input from the first reference voltage generator 72 or the reference voltage Vr48 input from the second reference voltage generator 73. The internal voltage step-down circuit 71 selects reference voltage Vr12 or Vr48 according to the burst length signal output from the mode register 19.

Figure 8:
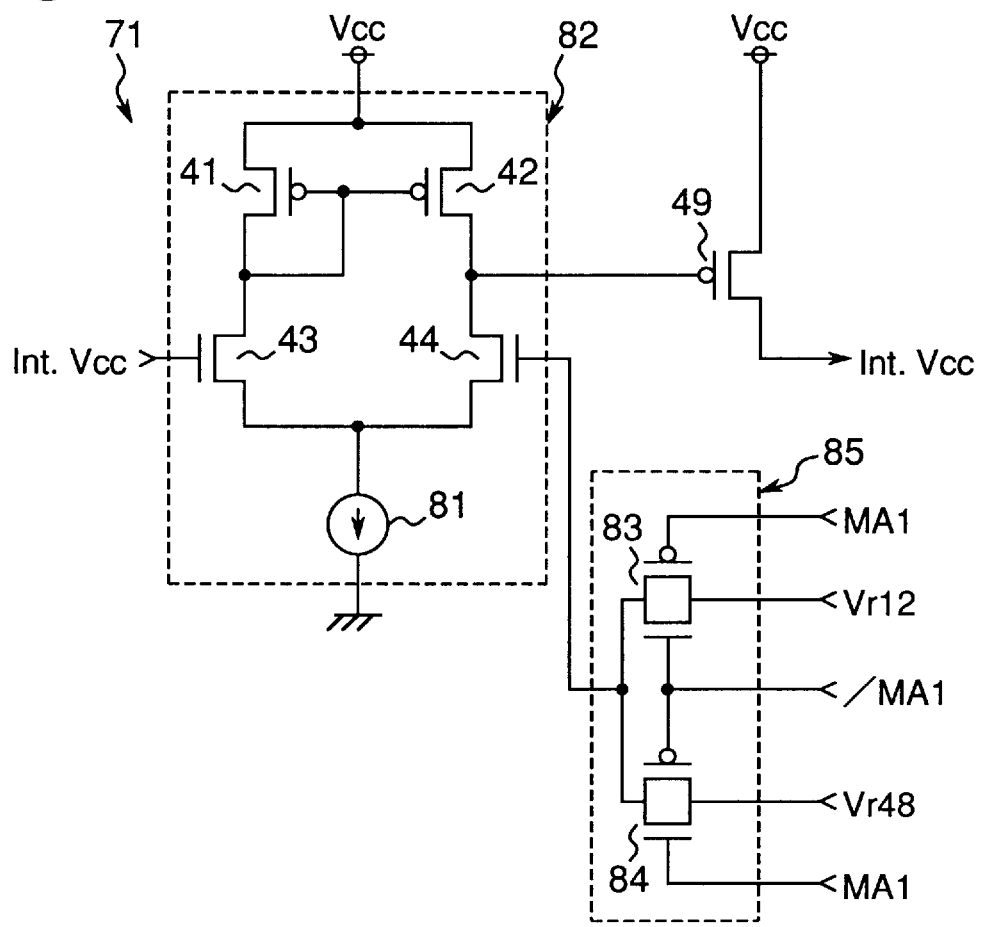
FIG. 8 is a circuit diagram of the internal voltage step-down circuit 71 shown in FIG. 7.

FIG. 8 is a circuit diagram of the internal voltage step-down circuit 71. Note that like parts in FIG. 8 and FIG. 3 are identified by the same reference numerals, and further description thereof is omitted below where only the differences are explained.

The internal voltage step-down circuit 71 shown in FIG. 8 differs from that in FIG. 3 in that the gain control circuit 48 shown in FIG. 3 is eliminated; the differential amplifier 82 includes a constant current supply 81 added to the differential amplifier 45 in FIG. 3; and a reference voltage switching circuit 85 comprising transmission gates 83 and 84 is added.

It should be noted that the differential amplifier 82 constitutes the differential amplifier circuit defined in the appended claims, and the reference voltage switching circuit 85 constitutes the reference voltage selector defined in the appended claims.

As shown in FIG. 8, the internal voltage step-down circuit 71 comprises a differential amplifier 82, reference voltage switching circuit 85, and p-channel MOS transistor 49 functioning as the output circuit of the internal voltage step-down circuit 71.

The differential amplifier 82 comprises two p-channel MOS transistors 41 and 42, two n-channel MOS transistors 43 and 44, and the constant current supply 81. The constant current supply 81 is inserted between the ground and the common source connection of the n-channel MOS transistors 43 and 44.

The reference voltage switching circuit 85 comprises transmission gates 83 and 84, the outputs of which are connected to the gate of n-channel MOS transistor 44. The input of the one transmission gate 83 is connected to the first reference voltage generator 72, and the input of the other transmission gate 84 is connected to the second reference voltage generator 73.

The non-inverted output MA1 of mode register 19 is connected to the gate of the p-channel MOS transistor of transmission gate 83 and the n-channel MOS transistor of transmission gate 84, and the inverted output /MA1 is connected to the n-channel MOS transistor gate of transmission gate 83 and the p-channel MOS transistor gate of transmission gate 84.

Thus comprised, the reference voltage Vr12 output from the first reference voltage generator 72 is input to the input of the connected transmission gate 83, and the reference voltage Vr48 output from the second reference voltage generator 73 is input to the connected transmission gate 84. Note that Vr48>Vr12.

When the burst length is 1 or 2, the non-inverted output MA1 of mode register 19 is LOW, and the inverted output /MA1 is HIGH. As a result, transmission gate 84 is off so that current flow is blocked, and transmission gate 83 is on so that current passes and reference voltage Vr12 is input to the gate of n-channel MOS transistor 44.

When the burst length is 4 or 8, the non-inverted output MA1 of mode register 19 is HIGH, and the inverted output /MA1 is LOW. In this case transmission gate 83 is off so that current flow is blocked, and transmission gate 84 is on so that current passes and reference voltage Vr48 is input to the gate of n-channel MOS transistor 44.

Because Vr48>Vr12, the voltage input to the gate of n-channel MOS transistor 44 is higher when the burst length is 4 or 8 than when the burst length is 1 or 2. In other words, increasing the reference voltage of the differential amplifier 82 increases the internal power supply voltage int.Vcc output from the internal voltage step-down circuit 71, and can thus compensate for the drop in the internal power supply voltage int.Vcc when the burst length is long.

The semiconductor integrated circuit device according to the third embodiment of the invention can thus change the internal power supply voltage int.Vcc output by the internal voltage step-down circuit 71 according to the burst length. More specifically, the internal power supply voltage int.Vcc output by the internal voltage step-down circuit 71 can be made higher when the burst length is 4 or 8 than when the burst length is 1 or 2, and it is possible to compensate for the drop in the internal power supply voltage int.Vcc that tends to occur when the burst length is long. It is thus possible to prevent the drop in the internal power supply voltage int.Vcc that occurs when the burst length is long.

Embodiment 4

A drop in the internal power supply voltage int.Vcc is prevented in the first to third embodiments described above using a single p-channel MOS transistor as the output circuit of the internal voltage step-down circuit. As described below according to the fourth embodiment, however, it is also possible to change the output current capacity of the internal voltage step-down circuit by using plural p-channel MOS transistors in the output circuit of the internal voltage step-down circuit, and changing the number of output circuit p-channel MOS transistors that are on according to the burst length.

Figure 9:
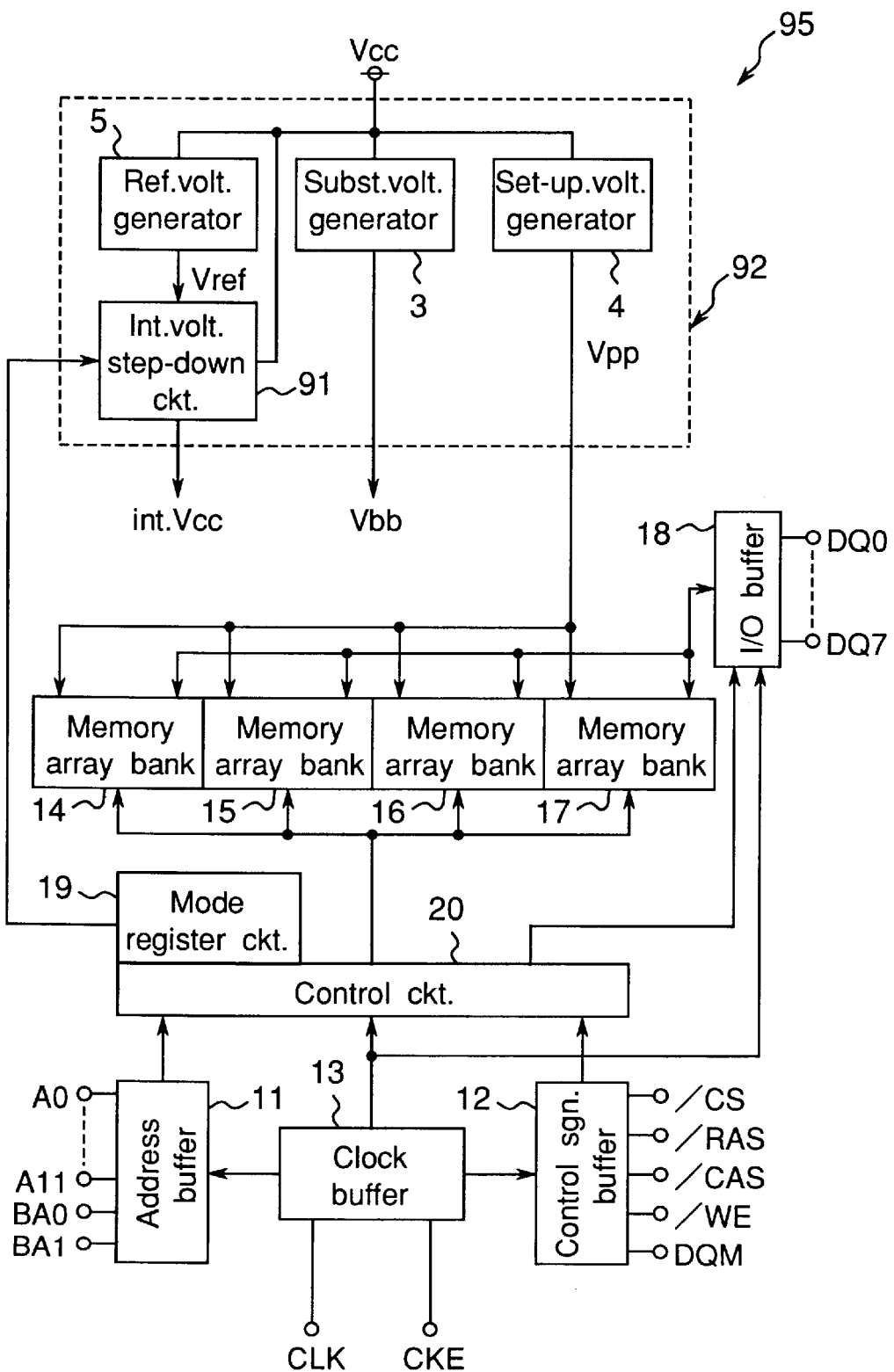
FIG. 9 is a block diagram of a semiconductor integrated circuit device according to the fourth embodiment of the invention.

FIG. 9 is a block diagram of a semiconductor integrated circuit device according to the fourth embodiment of the invention, which is described below using by way of example only a 64 Mbit×8 synchronous DRAM (SDRAM) device that operates in a burst mode. Note that like parts in FIG. 9 and FIG. 1 are identified by the same reference numerals, and further description thereof is omitted below. Only the differences between the first embodiment above and the fourth embodiment are described below. Note, further, that the SDRAM shown in FIG. 9 is again assumed to be capable of setting the burst length to 1, 2, 4, or 8 bits.

As in the previous embodiments, the semiconductor integrated circuit device shown in FIG. 9 differs from that in FIG. 1 in the construction of the internal power supply circuit. More specifically, the circuit design of the internal voltage step-down circuit 91 of the internal power supply circuit 92 of the fourth embodiment has been changed from that of the internal voltage step-down circuit 2 in FIG. 1.

The internal power supply circuit 92 of the SDRAM 95 of this fourth embodiment thus comprises the internal voltage step-down circuit 91, reference voltage generator 5 for generating and outputting a reference voltage Vref, substrate voltage generator 3, and step-up voltage generator 4. It should be noted that the internal voltage step-down circuit 91 is the internal voltage step-down means defined in the appended claims.

As shown in FIG. 9, the SDRAM 95 of this fourth embodiment thus comprises the internal power supply circuit 92 described above, an address buffer 11, control signal buffer 12, clock buffer 13, four memory array banks 14–17, an input/output (I/O) buffer 18 for data input/output, and a control circuit 20 comprising a mode register 19 and controlling the memory array banks 14–17 and I/O buffer 18.

The internal power supply circuit 92 is connected to the power supply terminal Vcc from which power is supplied from an external system. The reference voltage generator 5 is connected to the internal voltage step-down circuit 91. The internal voltage step-down circuit 91 is connected to the internal circuits of the SDRAM 1, but these various connections are not shown in the figure. The substrate voltage generator 3 is also connected to the semiconductor substrate on which the SDRAM 95 is formed, and these connections are also not shown. The mode register 19 is also connected to the internal voltage step-down circuit 91.

The internal voltage step-down circuit 91 steps down the power supply voltage input from an external system through the power supply terminal Vcc to generate the internal power supply voltage int.Vcc, and supplies the internal power supply voltage int.Vcc to the internal circuits of the SDRAM 95. Note that the internal power supply voltage int.Vcc is determined based on the reference voltage Vref input from the reference voltage generator 5. More specifically, the internal voltage step-down circuit 91 controls and outputs the internal power supply voltage int.Vcc at the level of the reference voltage Vref supplied from the reference voltage generator 5. The current supply capacity of the internal voltage step-down circuit 91 is switched according to the burst length signal output from the mode register 19.

Figure 10:
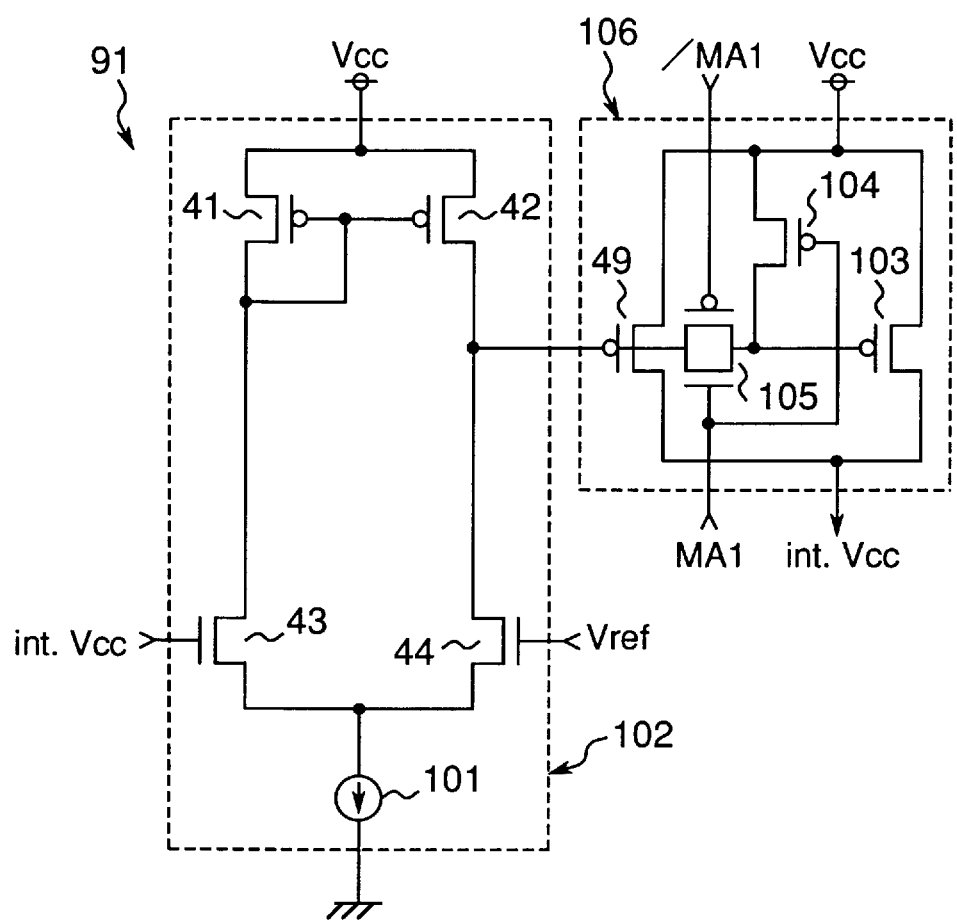
FIG. 10 is a circuit diagram of the internal voltage step-down circuit 91 shown in FIG. 9.

FIG. 10 is a circuit diagram of the internal voltage step-down circuit 91. Note that like parts in FIG. 10 and FIG. 3 are identified by the same reference numerals, and further description thereof is omitted below where only the differences are explained.

The internal voltage step-down circuit 91 shown in FIG. 10 differs from that in FIG. 3 in that the gain control circuit 48 shown in FIG. 3 is eliminated; the differential amplifier 102 includes a constant current supply 101 added to the differential amplifier 45 in FIG. 3; and the output circuit 106 comprises in addition to the p-channel MOS transistor 49 shown in FIG. 3 two p-channel MOS transistors 103 and 104, and a transmission gate 105.

It should be noted that the differential amplifier 102 constitutes the differential amplifier circuit defined in the appended claims, and the output circuit 106 constitutes the output circuit of the claims.

As shown in FIG. 10, the internal voltage step-down circuit 91 thus comprises differential amplifier 102 and output circuit 106.

The differential amplifier 102 comprises two p-channel MOS transistors 41 and 42, two n-channel MOS transistors 43 and 44, and the constant current supply 101. The constant current supply 101 is inserted between the ground and the common source connection of the n-channel MOS transistors 43 and 44.

The output circuit 106 comprises three p-channel MOS transistors 49, 103, and 104, and a transmission gate 105. The p-channel MOS transistor 49 gate is connected to the input of the transmission gate 105. The output of the transmission gate 105 is connected to the gate of p-channel MOS transistor 103, and this connection line is connected to the drain of p-channel MOS transistor 104. The power supply terminal Vcc is connected to the source of both p-channel MOS transistors 103 and 104. The drain of p-channel MOS transistor 103 is connected to the drain of p-channel MOS transistor 49, and this connection line is the output of the internal voltage step-down circuit 91.

The gate of the n-channel MOS transistor of the transmission gate 105, and the gate of p-channel MOS transistor 104, are connected to the non-inverted output MA1 of mode register 19. The gate of the p-channel MOS transistor of the transmission gate 105 is connected to the inverted output /MA1 of the mode register 19.

Thus comprised, when the burst length is 1 or 2, the non-inverted output MA1 of mode register 19 is LOW, and the inverted output /MA1 is HIGH. As a result, transmission gate 105 is off so that current flow is blocked, p-channel MOS transistor 104 is on, and the gate of p-channel MOS transistor 103 is HIGH. The p-channel MOS transistor 103 is therefore also off and current flow is blocked. When the burst length is 1 or 2, the output current of the internal voltage step-down circuit 91 is therefore the output current from the p-channel MOS transistor 49 only.

When the burst length is 4 or 8, the non-inverted output MA1 is HIGH and the inverted output /MA1 is LOW. This causes transmission gate 105 to be on and pass current while p-channel MOS transistor 104 is off and does not pass current. Continuity thus exists between the gates of p-channel MOS transistors 49 and 103, and the output current of the internal voltage step-down circuit 91 is supplied from both p-channel MOS transistors 49 and 103. As a result, the current supply capacity of the internal voltage step-down circuit 91 is greater when the burst length is 4 or 8 than when the burst length is 1 or 2.

The semiconductor integrated circuit device according to the fourth embodiment of the invention can thus change the current supply output from the internal voltage step-down circuit 91 according to the burst length. More specifically, it is possible to reduce the current supply output from the internal voltage step-down circuit 91 when the burst length is 1 or 2, and to increase the current supply when the burst length is 4 or 8.

It is therefore possible to prevent the drop in the internal power supply voltage int.Vcc that occurs when the burst length is long, and to reduce current consumption by the SDRAM 95 when the burst length is short by reducing the current supply output from the internal voltage step-down circuit 91.

Embodiment 5

In the first through fourth embodiments described above the output of the internal voltage step-down circuit is controlled according to the burst length to prevent a drop in the internal power supply voltage int.Vcc. It is also possible, however, to control the output of the substrate voltage generator according to the burst length as described below according to the fifth embodiment of the invention.

Figure 11:
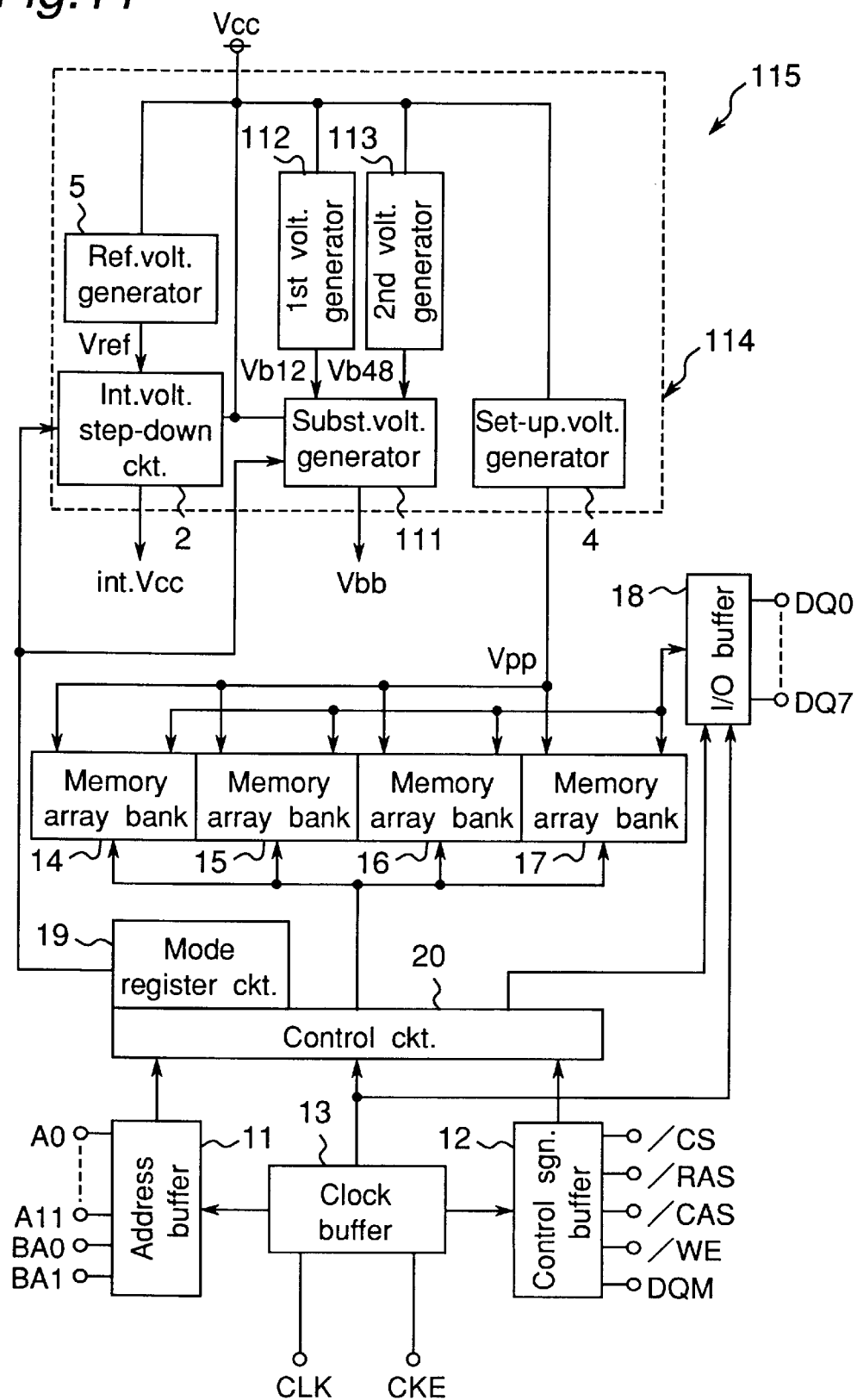
FIG. 11 is a block diagram of a semiconductor integrated circuit device according to the fifth embodiment of the invention.

FIG. 11 is a block diagram of a semiconductor integrated circuit device according to the fifth embodiment of the invention, which is described below using by way of example only a 64 Mbit×8 synchronous DRAM (SDRAM) device that operates in a burst mode. Note that like parts in FIG. 11 and FIG. 1 are identified by the same reference numerals, and further description thereof is omitted below. Only the differences between the first embodiment above and the fifth embodiment are described below. Note, further, that the SDRAM 115 shown in FIG. 11 is again assumed to be capable of setting the burst length to 1, 2, 4, or 8 bits.

The semiconductor integrated circuit device shown in FIG. 11 differs from that in FIG. 1 in the construction of the internal power supply circuit 114. More specifically, the circuit design of the substrate voltage generator 111 has been changed from that of the substrate voltage generator 3 in FIG. 1, and a first voltage generator 112 and second voltage generator 113 are added to the internal power supply circuit 10 shown in FIG. 1.

The internal power supply circuit 114 of the SDRAM 115 of this fifth embodiment thus comprises an internal voltage step-down circuit 2, substrate voltage generator 111, step-up voltage generator 4, reference voltage generator 5, first voltage generator 112 for generating and outputting a particular voltage Vb12, and second voltage generator 113 for generating and outputting a particular voltage Vb48.

The SDRAM 115 of the fifth embodiment shown in FIG. 11 thus comprises the internal power supply circuit 114 described above, address buffer 11, control signal buffer 12, clock buffer 13, four memory array banks 14–17, an input/output (I/O) buffer 18 for data input/output, and a control circuit 20 comprising a mode register 19 and controlling the memory array banks 14–17 and I/O buffer 18.

The internal power supply circuit 114 is connected to the power supply terminal Vcc from which power is supplied from an external system to the reference voltage generator 5. The reference voltage generator 5 is connected to the internal voltage step-down circuit 2, and the internal voltage step-down circuit 2 is connected to the internal circuits of the SDRAM 115, but these various connections are not shown in the figure. The first voltage generator 112 and second voltage generator 113 are separately connected to the substrate voltage generator 111. The substrate voltage generator 111 is connected to the semiconductor substrate on which the SDRAM 115 is formed, and these connections are also not shown in the figures. The mode register 19 is also connected to the internal voltage step-down circuit 2 and substrate voltage generator 111.

The internal voltage step-down circuit 2 steps down the power supply voltage input from an external system through the power supply terminal Vcc to generate the internal power supply voltage int.Vcc, and supplies the internal power supply voltage int.Vcc to the internal circuits of the SDRAM 115.

The substrate voltage generator 111 produces and outputs the semiconductor substrate bias voltage, and applies a negative substrate voltage Vbb to the semiconductor substrate.

Figure 12:
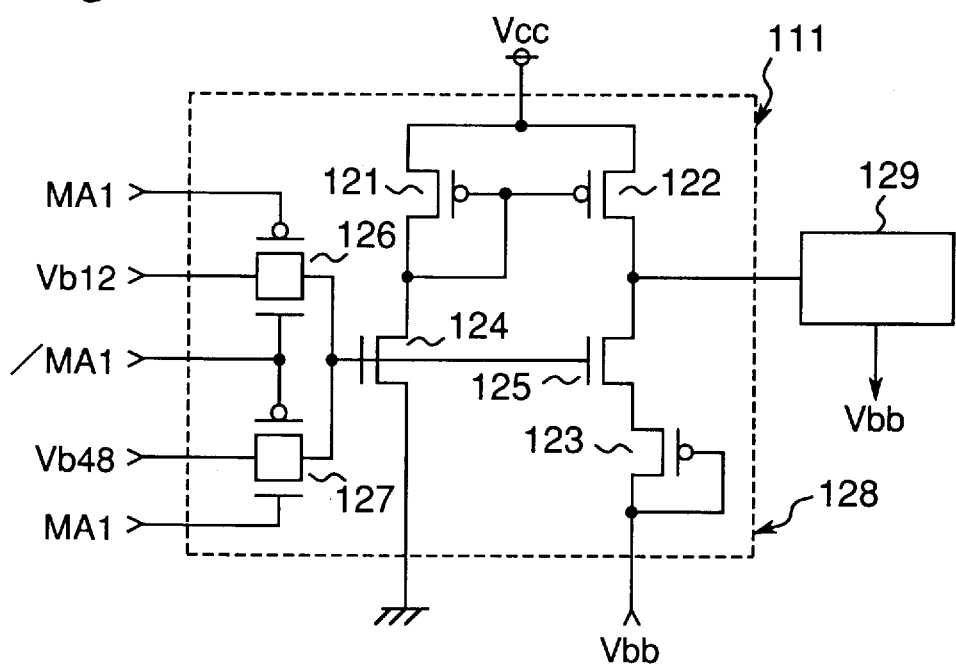
FIG. 12 is a circuit diagram of the substrate voltage generator 111 shown in FIG. 11.

FIG. 12 is a circuit diagram of the substrate voltage generator 111.

As shown in FIG. 12, the substrate voltage generator 111 comprises a substrate voltage detector 128 and a charge pump 129. The substrate voltage detector 128 comprises three p-channel MOS transistor 121, 122, and 123; two n-channel MOS transistors 124 and 125; and two transmission gates 126 and 127.

Note that the substrate voltage detector 128 constitutes the substrate voltage detecting means of the claims, and the charge pump 129 constitutes the charge pump circuit of the claims.

The common connection between the gates of p-channel MOS transistors 121 and 122 in the substrate voltage detector 128 is connected to the drain of the p-channel MOS transistor 121. The power supply terminal Vcc is connected to the source of both p-channel MOS transistors 121 and 122. The drain of the p-channel MOS transistor 121 is connected to the drain of the n-channel MOS transistor 124.

The drains of p-channel MOS transistors 122 and 125 are connected together, and this connection line is tapped as the output of the substrate voltage detector 128 to the input of the charge pump 129.

The output of the charge pump 129 is the output of the substrate voltage generator 111 from whence the substrate voltage Vbb is applied to the semiconductor substrate.

The source of n-channel MOS transistor 124 is grounded, and the source of n-channel MOS transistor 125 is connected to the source of p-channel MOS transistor 123. The gate of p-channel MOS transistor 123 is connected to the drain of p-channel MOS transistor 123, and the substrate voltage Vbb is input to this drain-gate connection. The gate of n-channel MOS transistor 124 is connected to the gate of n-channel MOS transistor 125, and this gate-gate connection is connected to the outputs of transmission gates 126 and 127.

The input of transmission gate 126 is connected to the first voltage generator 112, and the input of transmission gate 127 is connected to the second voltage generator 113. The non-inverted output MA1 of mode register 19 is connected to the gate of the p-channel MOS transistor of transmission gate 126 and to the gate of the n-channel MOS transistor of transmission gate 127. The inverted output /MA1 of mode register 19 is connected to the gate of the n-channel MOS transistor of transmission gate 126 and to the gate of the p-channel MOS transistor of transmission gate 127.

Thus comprised, the particular voltage Vb12 output from the first voltage generator 112 is input to the input of transmission gate 126, and the particular voltage Vb48 output from the second voltage generator 113 is input to the input of transmission gate 127. Note that Vb48>Vb12.

When the burst length is 1 or 2, the non-inverted output MA1 of mode register 19 is LOW, and the inverted output /MA1 is HIGH. As a result, transmission gate 126 is on so that current passes, and transmission gate 127 is off so that current flow is blocked. As a result, the particular voltage Vb12 is input to the gates of n-channel MOS transistors 124 and 125.

When the burst length is 4 or 8, the non-inverted output MA1 of mode register 19 is HIGH, and the inverted output /MA1 is LOW. In this case transmission gate 126 is off so that current flow is blocked, and transmission gate 127 is on so that current passes. As a result, the particular voltage Vb48 is input to the gates of n-channel MOS transistors 124 and 125.

n-channel MOS transistors 124 and 125 form the current supply of the substrate voltage detector 128. Note that Vb48>Vb12. As a result, the voltage input to the gates of n-channel MOS transistors 124 and 125 when the burst length is 4 or 8 is greater than the input voltage when the burst length is 1 or 2. In other words, the current flowing to n-channel MOS transistors 124 and 125 increases, the gate voltage of p-channel MOS transistors 121 and 122 drops, and the drain current of p-channel MOS transistor 122 rises.

When the substrate voltage Vbb rises, p-channel MOS transistor 123 turns off and current flow is blocked. The output of the substrate voltage detector 128 thus changes from LOW to HIGH, and the input to the charge pump 129 thus changes from LOW to HIGH. The LOW-to-HIGH transition time of the substrate voltage detector 128 output decreases as the current flow from the p-channel MOS transistor 122 increases.

More specifically, the change from LOW to HIGH in the output of the substrate voltage detector 128 after the p-channel MOS transistor 123 switches off and current flow is blocked due to a rise in the substrate voltage Vbb is faster when the burst length is 4 or 8 than when the burst length is 1 or 2, and the response of the substrate voltage detector 128 thus improves.

When the substrate voltage Vbb rises and the output of the substrate voltage detector 128 changes from LOW to HIGH, the charge pump 129 lowers the substrate voltage Vbb. When the substrate voltage Vbb drops, the p-channel MOS transistor 123 switches on, the output of the substrate voltage detector 128 turns LOW, and operation stops.

It should be noted that the fifth embodiment described above is achieved by modifying the substrate voltage generator 3 of the first embodiment to change the response of the substrate voltage detector according to the burst length, but the invention shall not be so limited. More specifically, the substrate voltage generator 3 used in the second, third, and fourth embodiments above can be replaced by the substrate voltage generator 111 of the fifth embodiment, and the first voltage generator 112 and second voltage generator 113 can be further added. It is also possible to add the above substrate voltage generator 111, first voltage generator 112, and second voltage generator 113 to a conventional internal power supply circuit comprising an internal voltage step-down circuit.

As described above, the semiconductor integrated circuit device according to the fifth embodiment of the present invention changes the response of the substrate voltage detector 128 in the substrate voltage generator 111 according to the burst length. More specifically, the response of the substrate voltage detector 128 in the substrate voltage generator 111 is better when the burst length is 4 or 8 than when the burst length is 1 or 2. As a result, the substrate voltage generator 111 can detect a rise in the substrate voltage Vbb in a short time when the burst length is 4 or 8, thereby rapidly lower the substrate voltage Vbb, and thus prevent the rise in the substrate voltage Vbb that tends to occur when the burst length is long.

Current consumption by the substrate voltage detector 128 can also be reduced when the burst length is short, and current consumption by the SDRAM 115 can therefore be reduced.

Embodiment 6

In the first through fourth embodiments described above the output of the internal voltage step-down circuit is controlled according to the burst length to prevent a drop in the internal power supply voltage int.Vcc. In the fifth embodiment the output of the substrate voltage generator is controlled according to the burst length. It also possible, however, to control the output of the step-up voltage generator according to the burst length as described below according to the sixth embodiment of the invention.

Figure 13:
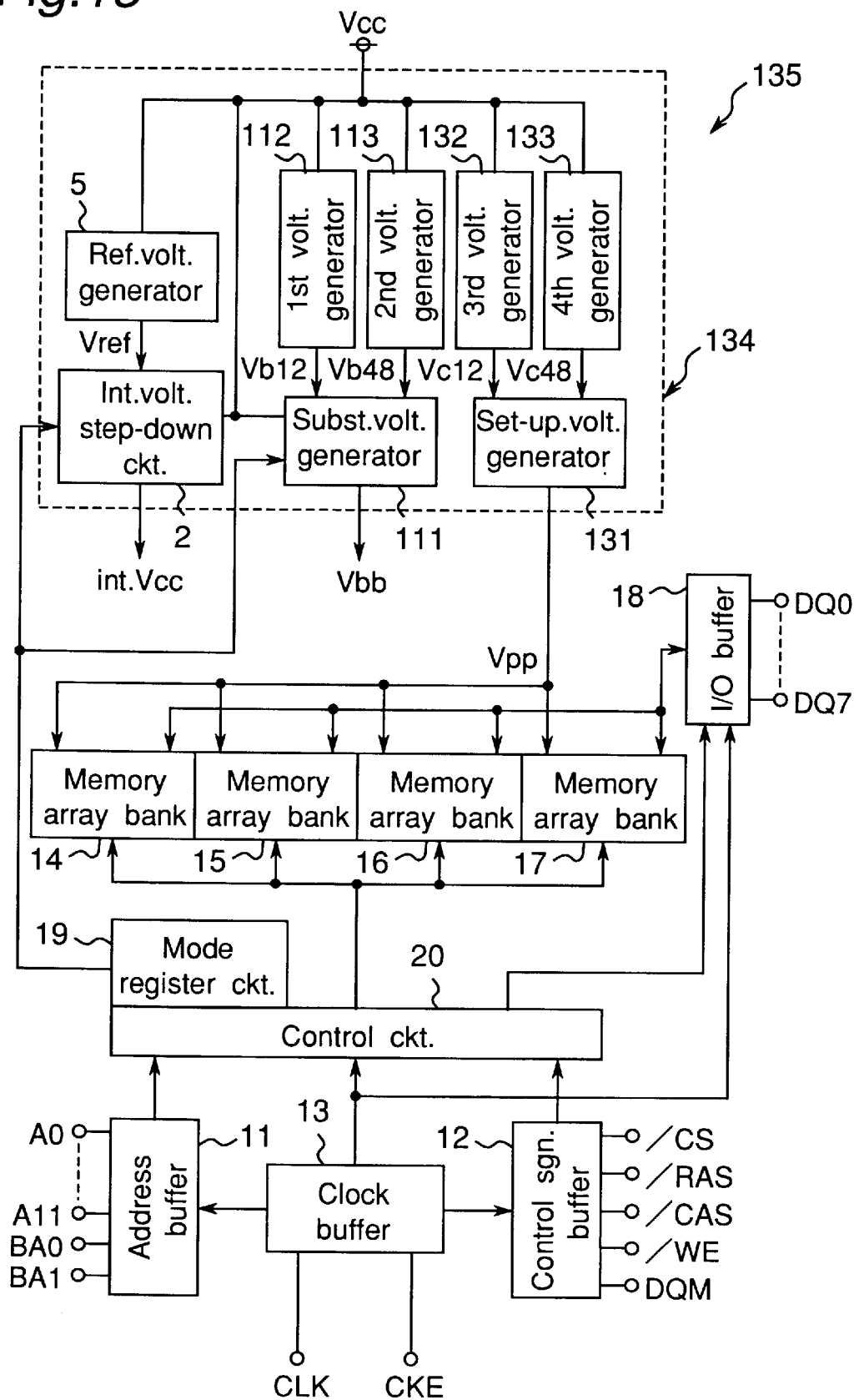
FIG. 13 is a block diagram of a semiconductor integrated circuit device according to the sixth embodiment of the invention.

FIG. 13 is a block diagram of a semiconductor integrated circuit device according to the sixth embodiment of the invention, which is described below using by way of example only a 64 Mbit×8 synchronous DRAM (SDRAM) device that operates in a burst mode. Note that like parts in FIG. 13 and FIG. 11 are identified by the same reference numerals, and further description thereof is omitted below. Only the differences between the fifth embodiment above and the sixth embodiment are described below. Note, further, that the SDRAM 135 shown in FIG. 13 is again assumed to be capable of setting the burst length to 1, 2, 4, or 8 bits.

The semiconductor integrated circuit device shown in FIG. 13 differs from that in FIG. 11 in the construction of the internal power supply circuit 134. More specifically, the circuit design of the step-up voltage generator 131 has been changed from that of the step-up voltage generator 4 in FIG. 11, and a third voltage generator 132 and fourth voltage generator 133 are added to the internal power supply circuit 114 shown in FIG. 11.

The internal power supply circuit 134 of the SDRAM 135 of this sixth embodiment thus comprises an internal voltage step-down circuit 2, substrate voltage generator 111, step-up voltage generator 131, reference voltage generator 5, first voltage generator 112, second voltage generator 113, third voltage generator 132 for generating and outputting a particular voltage Vc12, and fourth voltage generator 133 for generating and outputting a particular voltage Vc48.

Note that the step-up voltage generator 131, third voltage generator 132, and fourth voltage generator 133 constitute the step-up voltage generating means of the claims.

The SDRAM 135 of the sixth embodiment shown in FIG. 13 thus comprises the internal power supply circuit 134 described above, an address buffer 11, control signal buffer 12, clock buffer 13, four memory array banks 14–17, an input/output (I/O) buffer 18 for data input/output, and a control circuit 20 comprising a mode register 19 and controlling the memory array banks 14–17 and I/O buffer 18.

The internal power supply circuit 134 is connected to the power supply terminal Vcc from which power is supplied from an external system to the reference voltage generator 5. The reference voltage generator 5 is connected to the internal voltage step-down circuit 2, and the internal voltage step-down circuit 2 is connected to the internal circuits of the SDRAM 135, but these various connections are not shown in the figure. The first voltage generator 112 and second voltage generator 113 are separately connected to the substrate voltage generator 111. The substrate voltage generator 111 is connected to the semiconductor substrate on which the SDRAM 115 is formed, and these connections are also not shown in the figures.

The third voltage generator 132 and fourth voltage generator 133 are connected separately to the step-up voltage generator 131, and the step-up voltage generator 131 is connected to each of the memory array banks 14–17.

The mode register 19 is also connected to the internal voltage step-down circuit 2, substrate voltage generator 111, and step-up voltage generator 131.

The internal voltage step-down circuit 2 steps down the power supply voltage input from an external system through the power supply terminal Vcc to generate the internal power supply voltage int.Vcc, and supplies the internal power supply voltage int.Vcc to the internal circuits of the SDRAM 135.

The step-up voltage generator 131 steps up the power supply voltage input from an external system through the power supply terminal Vcc to generate the step-up voltage Vpp. The step-up voltage generator 131 supplies the step-up voltage Vpp to each of the memory array banks 14–17.

Figure 14:
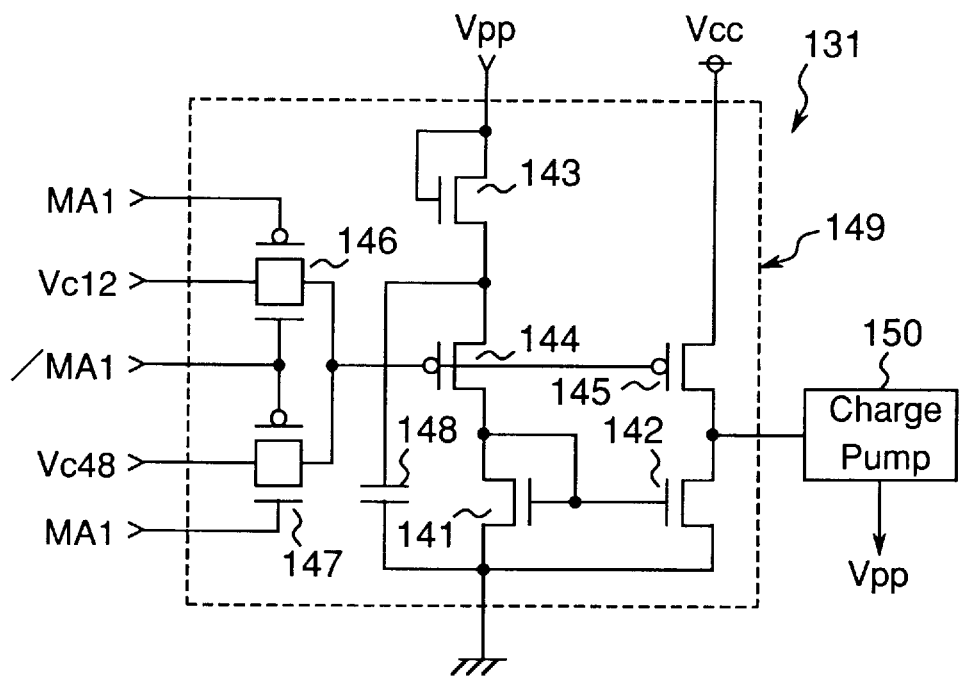
FIG. 14 is a circuit diagram of the step-up voltage generator 131 shown in FIG. 13.
Figure 15:
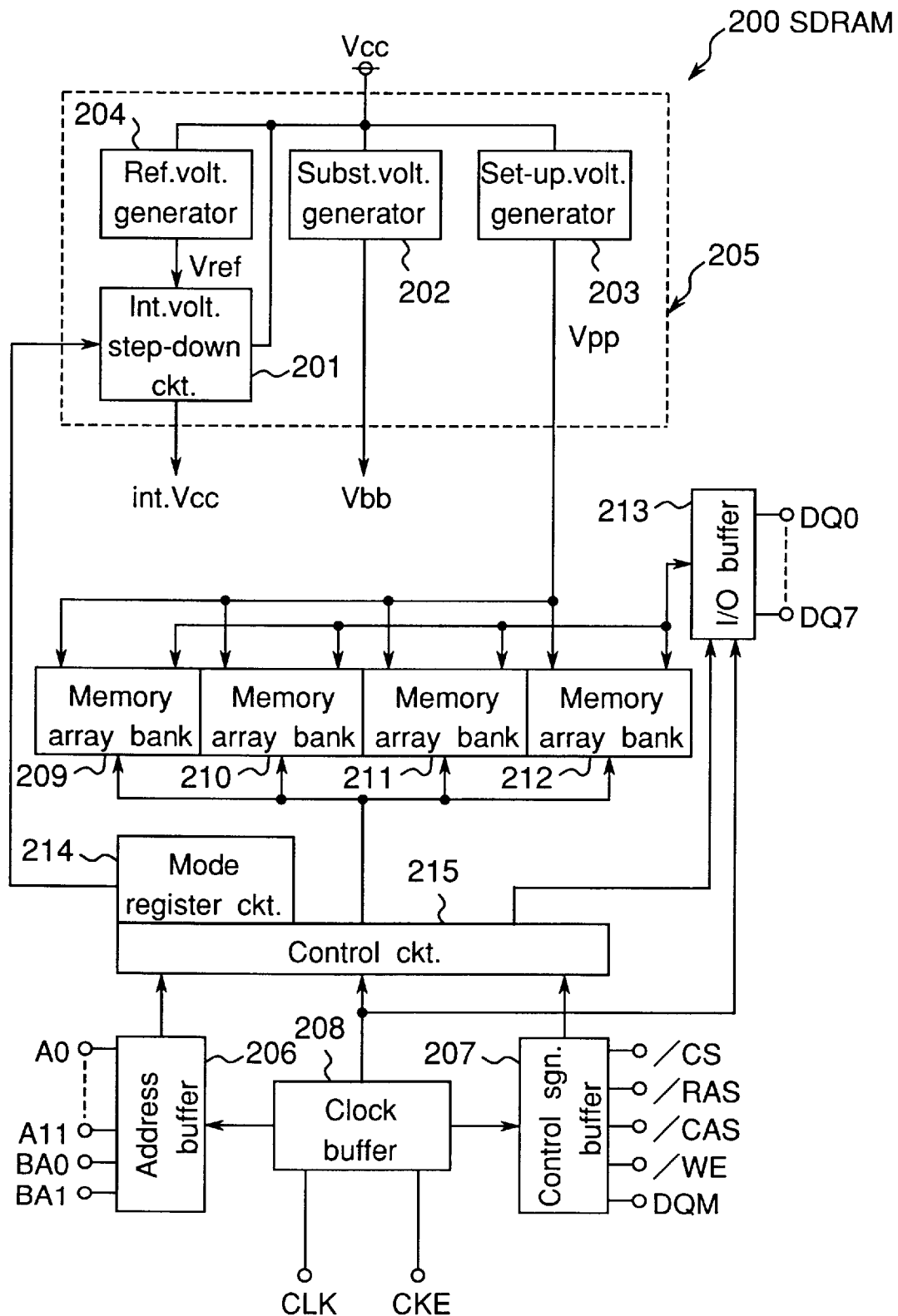
FIG. 15 is a block diagram of a conventional 64 Mbit×8 synchronous DRAM device that operates in a burst mode.

FIG. 14 is a circuit diagram of the step-up voltage generator 131.

As shown in FIG. 14, the step-up voltage generator 131 comprises a step-up voltage detector 149 and a charge pump 150. The step-up voltage detector 149 comprises three n-channel MOS transistors 141, 142, and 143; two p-channel MOS transistors 144 and 145; two transmission gates 146 and 147; and a capacitor 148.

Note that the step-up voltage detector 149 is the step-up voltage detecting means of the claims, and the charge pump 150 is the charge pump circuit of the claims.

In the step-up voltage detector 149 as shown in FIG. 14, the gate of n-channel MOS transistor 141 is connected to the gate of n-channel MOS transistor 142, and this connection line is connected to the drain of n-channel MOS transistor 141. The ground is connected to the source of both n-channel MOS transistor 141 and 142. The drain of n-channel MOS transistor 141 is connected to the drain of p-channel MOS transistor 144.

The drain of n-channel MOS transistor 142 is connected to the drain of p-channel MOS transistor 145, and this connection line is tapped as the output of the step-up voltage detector 149 connected to the input of charge pump 150.

The output of the charge pump 150 is the output of the step-up voltage generator 131 from whence the step-up voltage Vpp is output.

The source of p-channel MOS transistor 144 is connected to the source of n-channel MOS transistor 143, and capacitor 148 is inserted between this source-source connection and the ground. The source of p-channel MOS transistor 145 is connected to the power supply terminal Vcc. The gate of n-channel MOS transistor 143 is connected to the drain of n-channel MOS transistor 143, and the step-up voltage Vpp is applied to this gate-drain connection. The gate of p-channel MOS transistor 145 is connected to the gate of p-channel MOS transistor 144, and this gate-gate connection is connected to the outputs of transmission gates 146 and 147.

The input of transmission gate 146 is connected to the third voltage generator 132, and the input of transmission gate 147 is connected to the fourth [second, sic] voltage generator 133. The non-inverted output MA1 of mode register 19 is connected to the gate of the p-channel MOS transistor of transmission gate 146, and to the gate of the n-channel MOS transistor of transmission gate 147. The inverted output /MA1 of mode register 19 is connected to the gate of the n-channel MOS transistor of transmission gate 146, and to the gate of the p-channel MOS transistor of transmission gate 147.

Thus comprised, the particular voltage Vc12 output from the third voltage generator 132 is input to transmission gate 146, and the particular voltage Vc48 output from the fourth voltage generator 133 is input to transmission gate 147. Note that Vc12>Vc48.

When the burst length is 1 or 2, the non-inverted output MA1 of mode register 19 is LOW, and the inverted output /MA1 is HIGH. As a result, transmission gate 146 is on so that current passes, and transmission gate 147 is off so that current flow is blocked. As a result, the particular voltage Vc12 is input to the gates of p-channel MOS transistors 144 and 145.

When the burst length is 4 or 8, the non-inverted output MA1 of mode register 19 is HIGH, and the inverted output /MA1 is LOW. In this case transmission gate 146 is off so that current flow is blocked, and transmission gate 147 is on so that current passes. As a result, the particular voltage Vc48 is input to the gates of p-channel MOS transistors 144 and 145.

Because Vc12>Vc48 as described above, the voltage input to the gates of p-channel MOS transistors 144 and 145 when the burst length is 4 or 8 is less than the input voltage when the burst length is 1 or 2. In other words, when the current flowing to p-channel MOS transistors 144 and 145 increases and n-channel MOS transistor 143 is on, the gate voltage of n-channel MOS transistors 141 and 142 increases, and the drain current of p-channel MOS transistor 145 increases.

When the step-up voltage Vpp rises the n-channel MOS transistor 143 turns off and current flow is blocked. The output of the step-up voltage detector 149 thus changes from LOW to HIGH, and the input to the charge pump 150 thus also goes HIGH from LOW. The LOW-to-HIGH transition time of the step-up voltage detector 149 output decreases as the current flow from the p-channel MOS transistor 145 increases.

More specifically, the change from LOW to HIGH in the output of the step-up voltage detector 149 after the n-channel MOS transistor 143 switches off and current flow is blocked due to a drop in the step-up voltage Vpp is faster when the burst length is 4 or 8 than when the burst length is 1 or 2, and the response of the step-up voltage detector 149 thus improves.

When the step-up voltage Vpp drops and the step-up voltage detector 149 output goes HIGH from LOW, the charge pump 150 boosts the step-up voltage Vpp. When the step-up voltage Vpp rises, n-channel MOS transistor 143 switches on, the output of step-up voltage detector 149 goes LOW, and operation stops.

It should be noted that the sixth embodiment described above is achieved by modifying the step-up voltage generator 4 of the fifth embodiment to change the response of the step-up voltage detector according to the burst length, but the invention shall not be so limited. More specifically, the step-up voltage generator 131, third voltage generator 132, and fourth voltage generator 133 described above can also be used in place of the step-up voltage generator 4 in the first through fourth embodiments described above. It is also possible to add the step-up voltage generator 131, third voltage generator 132, and fourth voltage generator 133 described above to a conventional internal power supply circuit comprising an internal voltage step-down circuit and substrate voltage generator.

As described above, the semiconductor integrated circuit device according to the sixth embodiment of the present invention changes the response of the step-up voltage detector 149 of the step-up voltage generator 131 according to the burst length. More specifically, the response of the step-up voltage detector 149 in the step-up voltage generator 131 is better when the burst length is 4 or 8 than when the burst length is 1 or 2. As a result, the step-up voltage generator 131 can detect a drop in the step-up voltage Vpp in a short time when the burst length is 4 or 8, thereby rapidly increase the step-up voltage Vpp, and thus prevent the drop in the step-up voltage Vpp that tends to occur when the burst length is long.

Current consumption by the step-up voltage detector 149 can also be reduced when the burst length is short, and current consumption by the SDRAM 135 can therefore be reduced.

The semiconductor integrated circuit device according to the first embodiment of the invention determines the burst length by means of a burst length evaluation means, and increases the speed at which the output current is increased in response to the drop in the internal power supply voltage that occurs as the burst length increases. It is therefore possible to quickly increase the current supply in response to a drop in the internal power supply voltage when the burst length is long, and a drop in the internal power supply voltage can be prevented from occurring when the burst length is long.

The internal voltage step-down means of the semiconductor integrated circuit device according to the second embodiment of the invention selects a reference voltage that increases as the burst length increases, and thereby compensates for a drop in the internal power supply voltage. The internal power supply voltage output from the internal voltage step-down means is thereby increased when the burst length is long, thus compensating for the drop in the internal power supply voltage that occurs when the burst length is long. It is therefore also possible to prevent a drop in the internal power supply voltage from occurring when the burst length is long.

The semiconductor integrated circuit device according to the third embodiment of the invention increases the current supply capacity of the internal voltage step-down means when the burst length is long. It is therefore possible to reduce the current supply capacity of the internal voltage step-down means when the burst length is short, and to increase the current supply capacity of the internal voltage step-down means when the burst length is long. It is therefore possible to prevent the drop in the internal power supply voltage that occurs when the burst length is long, and to reduce the current consumption of the semiconductor integrated circuit device by reducing the output current of the internal voltage step-down means when the burst length is short.

With the semiconductor integrated circuit device according to the fourth embodiment of the invention, response to an increase in the substrate voltage improves as the burst length increases, and the speed at which a rise in the substrate voltage is detected is improved. It is therefore possible to prevent the rise in the substrate voltage that occurs when the burst length is long because the substrate voltage rise when the burst length is long can be detected in a short time, thereby enabling the substrate voltage to be reduced.

With the semiconductor integrated circuit device according to the fifth embodiment of the invention, response to a drop in the step-up voltage improves as the burst length increases, and the speed at which a drop in the step-up voltage is detected is improved. It is therefore possible to prevent the drop in the step-up voltage that occurs when the burst length is long because the step-up voltage drop when the burst length is long can be detected in a short time, thereby enabling the step-up voltage to be increased.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit device that operates in a burst mode comprising:

an internal voltage step-down means for stepping down a power supply voltage supplied from an external system to generate and output an internal power supply voltage based on a particular reference voltage; and a burst length evaluation means for determining the burst length from an address data input from the external system, wherein said internal voltage step-down means increases the speed at which rate of increase of a current output from said internal voltage step-down means rises in response to a drop in the internal power supply voltage as the burst length determined by said burst length evaluation means increases.

2. The semiconductor integrated circuit device according to claim 1 wherein said internal voltage step-down means comprises a differential amplifier to which the output internal power supply voltage and a particular reference voltage are input, a gain control means for controlling a current flowing through said differential amplifier to control the gain of said differential amplifier, and an output circuit for changing the current supply capacity according to the output voltage of said differential amplifier, wherein said gain control means increases the current flow to said differential amplifier and increases the gain of said differential amplifier as the burst length increases.

3. The semiconductor integrated circuit device according to claim 2 wherein said gain control means comprises plural MOS transistors of varying gate sizes for supplying current to said differential amplifier, and increases the current flow to said differential amplifier as the burst length increases by operating a MOS transistor with a larger drain current.

4. The semiconductor integrated circuit device according to claim 2 wherein said gain control means comprises plural MOS transistors for supplying current to said differential amplifier, and increases the current flow to said differential amplifier as the burst length increases by increasing the number of operating MOS transistors.

5. The semiconductor integrated circuit device according to claim 2 wherein said gain control means comprises a MOS transistor for supplying current to said differential amplifier, and a gate voltage control circuit for controlling the gate voltage of said MOS transistor according to the burst length, and said gate voltage control circuit controls the gate voltage of said MOS transistor to increase the current supply to said differential amplifier as the burst length increases.

6. The semiconductor integrated circuit device according to claim 1 further comprising a substrate voltage generating means for generating and outputting a semiconductor substrate bias voltage, and applying the substrate voltage to a semiconductor substrate of the device, and wherein said substrate voltage generating means improves response to an increase in the substrate voltage, and increases the speed at which a rise in the substrate voltage is detected, as the burst length determined by said burst length evaluation means increases.

7. The semiconductor integrated circuit device according to claim 1 further comprising a step-up voltage generating means for generating and outputting a step-up voltage by boosting the externally supplied power voltage, and wherein said step-up voltage generating means improves response to a drop in the step-up voltage, and increases the speed at which a drop in the step-up voltage is detected, as the burst length determined by said burst length evaluation means increases.

8. A semiconductor integrated circuit device that operates in a burst mode comprising:

an internal voltage step-down means for stepping down a power supply voltage supplied from an external system to generate and output an internal power supply voltage based on a particular reference voltage; and a burst length evaluation means for determining the burst length from address data input from the external system, and wherein said internal voltage step-down means increases the output current supply capacity as the burst length determined by the burst length evaluation means increases.

9. The semiconductor integrated circuit device according to claim 8 wherein said internal voltage step-down means comprises a differential amplifier to which the output internal power supply voltage and a particular reference voltage are input, and an output circuit for changing the current supply capacity according to the burst length, wherein said output circuit increases the output current supply capacity as the burst length increases.

10. The semiconductor integrated circuit device according to claim 8 further comprising a substrate voltage generating means for generating and outputting a semiconductor substrate bias voltage, and applying the substrate voltage to a semiconductor substrate of the device, and wherein said substrate voltage generating means improves response to an increase in the substrate voltage, and increases the speed at which a rise in the substrate voltage is detected, as the burst length determined by said burst length evaluation means increases.

11. The semiconductor integrated circuit device according to claim 8 further comprising a step-up voltage generating means for generating and outputting a step-up voltage by boosting the externally supplied power voltage, and wherein said step-up voltage generating means improves response to a drop in the step-up voltage, and increases the speed at which a drop in the step-up voltage is detected, as the burst length determined by said burst length evaluation means increases.

* * * * *